US012607663B2

(12) United States Patent
Liu et al.

(10) Patent No.: US 12,607,663 B2
(45) Date of Patent: Apr. 21, 2026

(54) METHOD AND SYSTEM FOR LOCATING FAULT OF COMPLEX POWER LINE, DEVICE, AND STORAGE MEDIUM

(71) Applicant: Electric Power Research Institute of Yunnan Power Grid Co., Ltd, Yunnan (CN)

(72) Inventors: Hongwen Liu, Yunnan (CN); Xiangjun Zeng, Yunnan (CN); Jindong Yang, Yunnan (CN); Hao Bai, Yunnan (CN); Ding Nie, Yunnan (CN); Jisheng Huang, Yunnan (CN); Lijun Tang, Yunnan (CN); Guochao Qian, Yunnan (CN); Dexu Zou, Yunnan (CN); Xincui Tian, Yunnan (CN)

(73) Assignee: Electric Power Research Institute of Yunnan Power Grid Co., Ltd, Yunnan (CN)

( * ) Notice: Subject to any disclaimer, the term of this patent is extended or adjusted under 35 U.S.C. 154(b) by 478 days.

(21) Appl. No.: 18/176,486

(22) Filed: Mar. 1, 2023

(65) Prior Publication Data

US 2023/0280386 A1 Sep. 7, 2023

(30) Foreign Application Priority Data

Mar. 2, 2022 (CN) .......................... 202210203932.0

(51) Int. Cl.
*G01R 31/08* (2020.01)

(52) U.S. Cl.
CPC ......... *G01R 31/085* (2013.01); *G01R 31/088* (2013.01)

(58) Field of Classification Search
CPC .... G01R 31/085; G01R 31/088; G01R 31/00; Y04S 10/52; Y04S 10/00
See application file for complete search history.

(56) References Cited

U.S. PATENT DOCUMENTS

2018/0210060 A1* 7/2018 Guzman-Casillas .. G01R 35/00

FOREIGN PATENT DOCUMENTS

CN 112363021 A * 2/2021 ........... G01R 31/088
CN 112946424 A * 6/2021 ........... G01R 31/088

OTHER PUBLICATIONS

YANG_CN11263021A_ENGLISH_Translation_Used_for_Examination_PE2EDocViewerVersion_2020 (Year: 2020).*
(Continued)

*Primary Examiner* — Catherine T. Rastovski
*Assistant Examiner* — Toni D Sauncy
(74) *Attorney, Agent, or Firm* — JCIPRNET

(57) ABSTRACT

A method and a system for locating a fault of a complex power line are provided. Several monitoring points on the complex power line can be obtained by providing several traveling wave head monitoring sensors on the complex power line. The complex power line is transformed into coordinates in conjunction with an arrival moment and a location corresponding to the monitoring points, thereby establishing a trunk line fault-locating equation related to a line location, the arrival moment, and a traveling wave propagation speed, from which a first fault point can thus be derived simply and quickly. If a fault point is located on a branch line, a branch line fault-locating equation is then established to derive a second fault point. Furthermore, the first fault point and the second fault point serve as a basis for deriving a target fault point of the complex power line.

11 Claims, 7 Drawing Sheets

(56) References Cited

OTHER PUBLICATIONS

Gonzalez-Sanchez, et al., "Fault location on transmission lines based on travelling waves using correlation and MODWT", Electric Power Systems Research 197 (2021) 107308 (Year: 2021).*

Qianqian, et al. "A New Smart Distribution Grid Fault Self-healing System Based on Traveling-wave", IEEE, 2013-PSEC-261 (Year: 2013).*

Yuan, et al., "Traveling Wave Time Difference Based Multiterminal Transmission Network Fault Location", 4th IEEE Conference on Energy Internet and Energy System Integration Oct. 30-Nov. 1, 2020. Wuhan, China. (Year: 2020).*

QUALITROL_CommercialWebsite_"What is Traveling Wave Fault Location", Wayback Machine URL Capture_Date: Jan. 27, 2022. (Year: 2022).*

Taylor, MS Thesis "Design and Analysis of a Traveling Wave Fault Locator", Louisiana Tech University, Aug. 2019. Available online. (Year: 2019).*

Buzo, et al., "A New Method for Fault Location in Distribution Networks Based on Voltage Sag Measurements", IEEE Transactions On Power Delivery, vol. 36, No. 2, Apr. 2021. (Year: 2021).*

Mosavi, et al. "Traveling-Wave Fault Location Techniques in Power System . . . ", Research Gate, personal communication, 2015; available online. (Year: 2020).*

Naidu, et al., "Precise Traveling Wave-Based Transmission Line Fault Location Method Using Single-Ended Data", IEEE Transactions On Industrial Informatics, vol. 17, No. 8, Aug. 2021 5197 (Year: 2021).*

Yu, et al., "Novel Traveling Wave Fault Location Method for Transmission Network Based on Directed Tree Model and Linear Fitting", IEEE Access (online), vol. 8, Jul. 2020. (Year: 2020).*

Bayatu, et al., "Local Fault Location in Meshed DC Microgrids Based On Parameter Estimation Technique", IEEE Systems , vol. 16, No. 1, Mar. 2022 ; Online date of Pub: Sep. 15, 2021. (Year: 2021).*

Muzzammel, et al., "HVdc Systems Fault Classification and Location Methods Based on Traveling and Non-Traveling Waves: A Comprehensive Review", Appl. Sci. 2019, 9(22), 4760. (Year: 2019).*

XU_CN112946424A_ENGLISHTranslation_Used_For_Examination Method And Device (Year: 2021).*

* cited by examiner

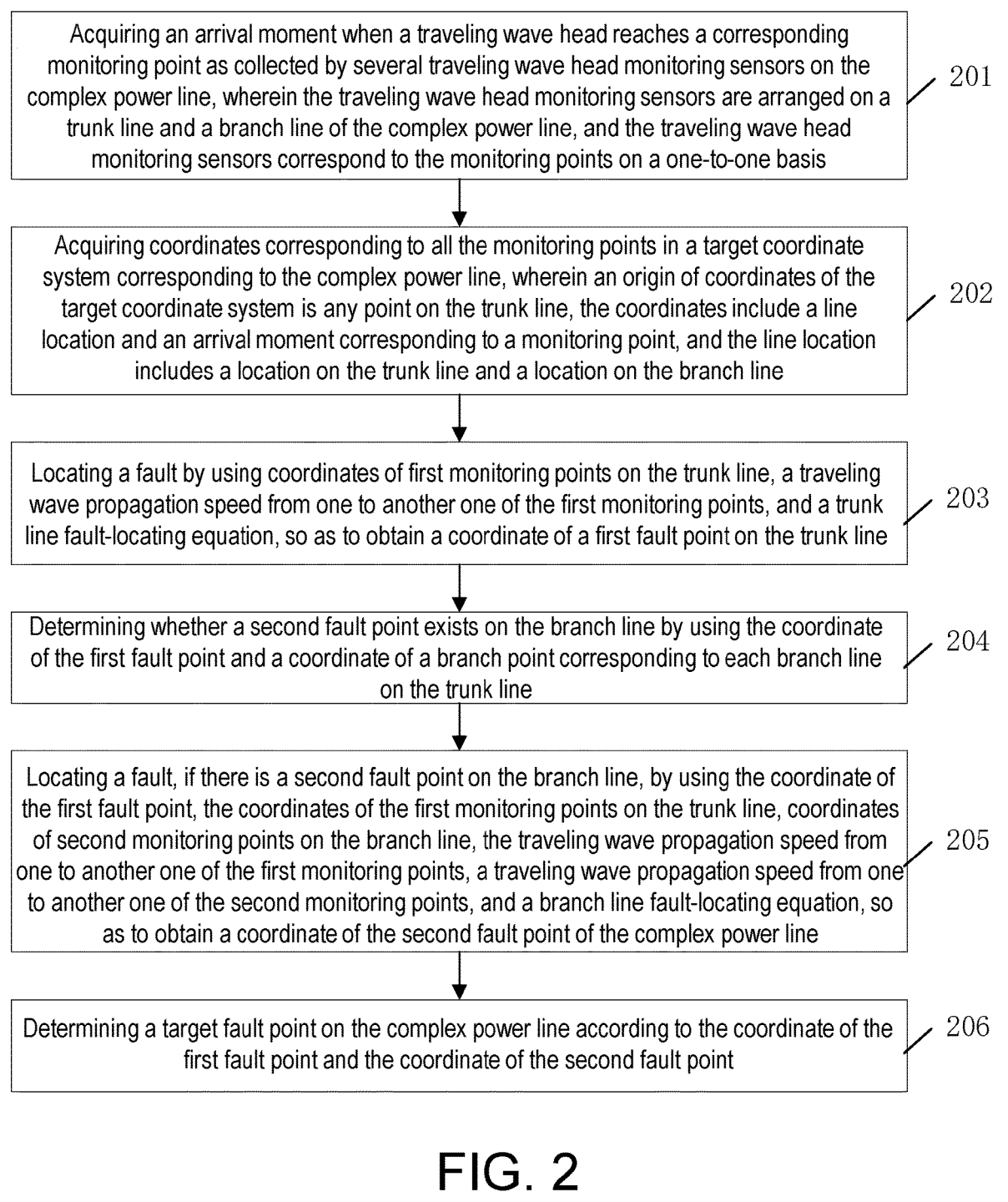

Acquiring an arrival moment when a traveling wave head reaches a corresponding monitoring point as collected by several traveling wave head monitoring sensors on the complex power line, wherein the traveling wave head monitoring sensors are arranged on a trunk line and a branch line of the complex power line, and the traveling wave head monitoring sensors correspond to the monitoring points on a one-to-one basis      201

Acquiring coordinates corresponding to all the monitoring points in a target coordinate system corresponding to the complex power line, wherein an origin of coordinates of the target coordinate system is any point on the trunk line, the coordinates include a line location and an arrival moment corresponding to a monitoring point, and the line location includes a location on the trunk line and a location on the branch line      202

Locating a fault by using coordinates of first monitoring points on the trunk line, a traveling wave propagation speed from one to another one of the first monitoring points, and a trunk line fault-locating equation, so as to obtain a coordinate of a first fault point on the trunk line      203

Determining whether a second fault point exists on the branch line by using the coordinate of the first fault point and a coordinate of a branch point corresponding to each branch line on the trunk line      204

Locating a fault, if there is a second fault point on the branch line, by using the coordinate of the first fault point, the coordinates of the first monitoring points on the trunk line, coordinates of second monitoring points on the branch line, the traveling wave propagation speed from one to another one of the first monitoring points, a traveling wave propagation speed from one to another one of the second monitoring points, and a branch line fault-locating equation, so as to obtain a coordinate of the second fault point of the complex power line      205

Determining a target fault point on the complex power line according to the coordinate of the first fault point and the coordinate of the second fault point      206

FIG. 2

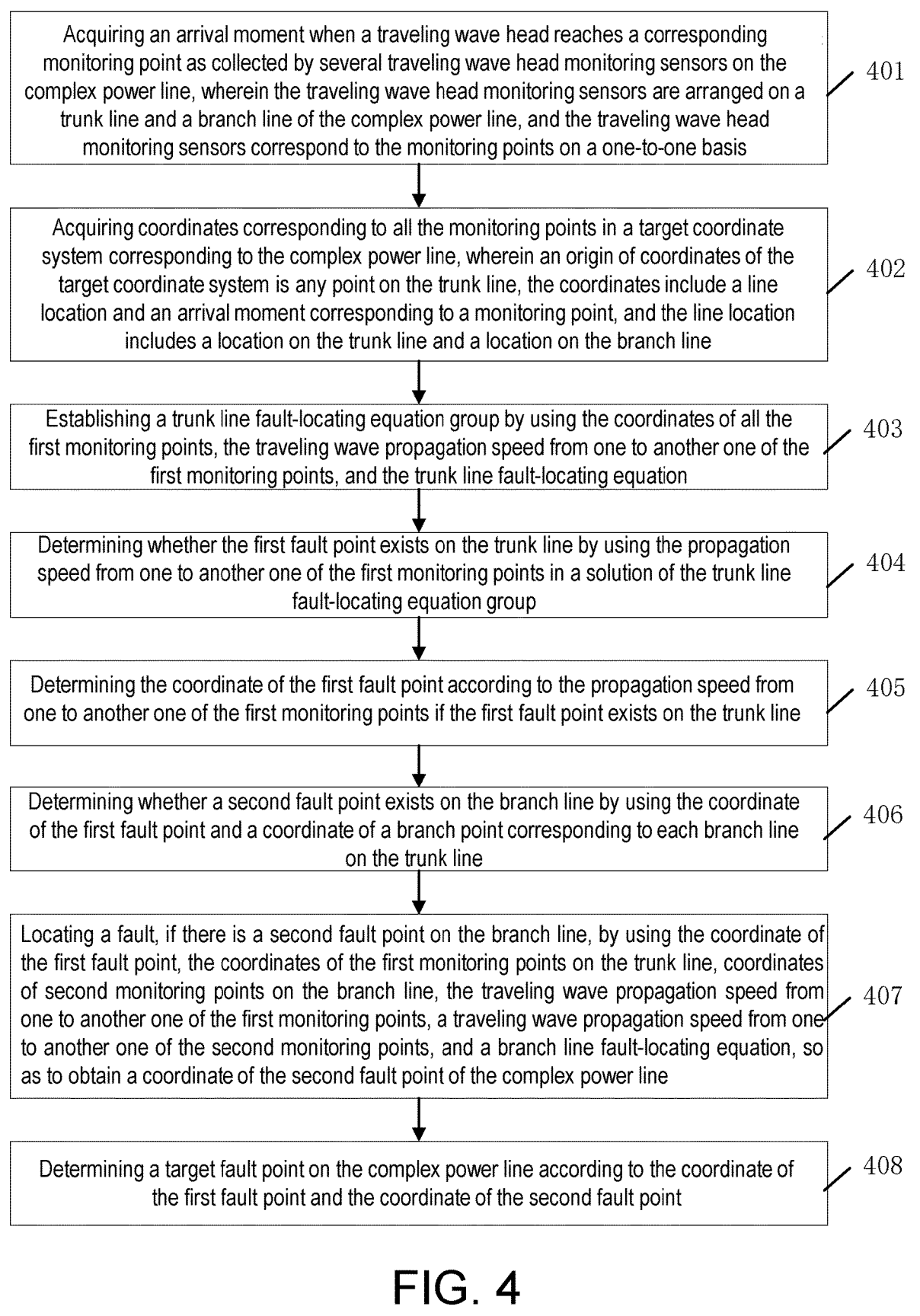

Acquiring an arrival moment when a traveling wave head reaches a corresponding monitoring point as collected by several traveling wave head monitoring sensors on the complex power line, wherein the traveling wave head monitoring sensors are arranged on a trunk line and a branch line of the complex power line, and the traveling wave head monitoring sensors correspond to the monitoring points on a one-to-one basis — 401

Acquiring coordinates corresponding to all the monitoring points in a target coordinate system corresponding to the complex power line, wherein an origin of coordinates of the target coordinate system is any point on the trunk line, the coordinates include a line location and an arrival moment corresponding to a monitoring point, and the line location includes a location on the trunk line and a location on the branch line — 402

Establishing a trunk line fault-locating equation group by using the coordinates of all the first monitoring points, the traveling wave propagation speed from one to another one of the first monitoring points, and the trunk line fault-locating equation — 403

Determining whether the first fault point exists on the trunk line by using the propagation speed from one to another one of the first monitoring points in a solution of the trunk line fault-locating equation group — 404

Determining the coordinate of the first fault point according to the propagation speed from one to another one of the first monitoring points if the first fault point exists on the trunk line — 405

Determining whether a second fault point exists on the branch line by using the coordinate of the first fault point and a coordinate of a branch point corresponding to each branch line on the trunk line — 406

Locating a fault, if there is a second fault point on the branch line, by using the coordinate of the first fault point, the coordinates of the first monitoring points on the trunk line, coordinates of second monitoring points on the branch line, the traveling wave propagation speed from one to another one of the first monitoring points, a traveling wave propagation speed from one to another one of the second monitoring points, and a branch line fault-locating equation, so as to obtain a coordinate of the second fault point of the complex power line — 407

Determining a target fault point on the complex power line according to the coordinate of the first fault point and the coordinate of the second fault point — 408

FIG. 4

METHOD AND SYSTEM FOR LOCATING FAULT OF COMPLEX POWER LINE, DEVICE, AND STORAGE MEDIUM

CROSS-REFERENCE TO RELATED APPLICATION

This application claims the priority benefit of China application no. 202210203932.0, filed on Mar. 2, 2022. The entirety of the above-mentioned patent application is hereby incorporated by reference and made a part of this specification.

BACKGROUND

Technical Field

The present disclosure relates to the technical field of fault locating for AC/DC power transmission and distribution lines of power systems, and more particularly, to a method and a system for locating a fault of a complex power line, a device, and a storage medium.

Description of Related Art

In a power system, AC/DC transmission and distribution lines are important components, faults of which affect the stability of the system and cause the interruption of the power supply for a user. Manual search for fault points is time-consuming labor, and rapid and accurate fault-locating technology is conducive to the timely repair of fault lines and can avoid the economic loss caused by a power outage while reducing the difficulty of manual inspection. Power system fault-locating technology mainly includes an imped-ance method and a traveling wave method. The impedance method is easily affected by fault resistance, transformer errors, and power parameters, and its practical application effect is not desirable. The traveling wave method has been widely used in power systems because of its simple mecha-nism and high accuracy but is defective for its uncertain wave speed in a cable, a loss of traveling wave information that may result in a locating fault, and poor reliability and locating accuracy in a multi-branch complex power line.

Now a distributed fault-locating technology has a good prospect of engineering application, and a method, system, and DC transmission line for fault locating have been proposed by Chu Xu et al. of Hunan University, disclosing that fault locating by means of sensors in a fault section and adjacent sensors can eliminate the impact of wave speed. However, this needs to determine the fault section first, and a fault-locating equation thereof is complex; the locating equation at both ends and the fault-locating equation along the line are not consistent, and the traveling wave fault-locating calculation often fails in complex branch lines.

With the progress of the construction of new power systems based on new energy, there has been a large-scale introduction of distributed energy, accompanied by more and more complex AC/DC transmission and distribution lines, with an increasing number of branches; a simple, reliable, accurate and fast fault-locating technology is desir-able.

Therefore, how to further improve the accuracy and reliability of traveling wave fault locating in multi-branch complex lines and simplify the locating calculation has become an urgent technical problem to be solved in the industry.

SUMMARY

It is a major object of the present disclosure to provide a method and a system for locating a fault of a complex power line, a device, and a storage medium that can solve the technical problem of low accuracy and reliability of travel-ing wave fault locating in the prior art.

To achieve the above object, a first aspect of the present disclosure provides a method for locating a fault of a complex power line, including: acquiring an arrival moment when a traveling wave head reaches a corresponding moni-toring point as collected by several traveling wave head monitoring sensors on the complex power line, wherein the traveling wave head monitoring sensors are arranged on a trunk line and a branch line of the complex power line, and the traveling wave head monitoring sensors correspond to the monitoring points on a one-to-one basis; acquiring coordinates corresponding to all the monitoring points in a target coordinate system corresponding to the complex power line, wherein an origin of coordinates of the target coordinate system is any point on the trunk line, the coor-dinates include a line location and an arrival moment corresponding to a monitoring point, and the line location includes a location on the trunk line and a location on the branch line; locating a fault by using coordinates of first monitoring points on the trunk line, a traveling wave propa-gation speed from one to another of the first monitoring points, and a trunk line fault-locating equation, so as to obtain a coordinate of a first fault point on the trunk line; determining whether a second fault point exists on the branch line by using the coordinate of the first fault point and a coordinate of a branch point corresponding to each branch line on the trunk line; locating a fault, if there is a second fault point on the branch line, by using the coordinate of the first fault point, the coordinates of the first monitoring points on the trunk line, coordinates of second monitoring points on the branch line, the traveling wave propagation speed from one to another of the first monitoring points, a traveling wave propagation speed from one to another of the second monitoring points, and a branch line fault-locating equation, so as to obtain a coordinate of the second fault point of the complex power line; and determining a target fault point on the complex power line according to the coordinate of the first fault point and the coordinate of the second fault point.

In a possible implementation, the locating a fault by using coordinates of first monitoring points on the trunk line, a traveling wave propagation speed from one to another of the first monitoring points, and a trunk line fault-locating equa-tion, so as to obtain a coordinate of a first fault point on the trunk line includes: establishing a trunk line fault-locating equation group by using the coordinates of all the first monitoring points, the traveling wave propagation speed from one to another of the first monitoring points, and the trunk line fault-locating equation; determining whether the first fault point exists on the trunk line by using the propa-gation speed from one to another of the first monitoring points in a solution of the trunk line fault-locating equation group; and determining the coordinate of the first fault point according to the propagation speed from one to another of the first monitoring points if the first fault point exists on the trunk line.

In a possible implementation, the locating a fault by using the coordinate of the first fault point, the coordinates of the first monitoring points on the trunk line, coordinates of second monitoring points on the branch line, the traveling wave propagation speed from one to another of the first monitoring points, a traveling wave propagation speed from one to another of the second monitoring points, and a branch line fault-locating equation, so as to obtain a coordinate of the second fault point of the complex power line includes: establishing a branch line fault-locating equation group by using the coordinate of the first fault point, the coordinates of the first monitoring points on the trunk line, the coordinates of the second monitoring points on the branch line, the traveling wave propagation speed from one to another of the first monitoring points, the traveling wave propagation speed from one to another of the second monitoring points, and the branch line fault-locating equation, so as to determine the coordinate of the second fault point.

In a possible implementation, the trunk line fault-locating equation includes:

$$\begin{cases} (x - x_0)^2 = (t - t_0)^2 v^2 \\ (x - x_1)^2 = (t - t_1)^2 v^2 \\ (x - x_2)^2 = (t - t_2)^2 v^2 \\ \vdots \\ (x - x_i)^2 = (t - t_i)^2 v^2 \end{cases}$$

or $$\begin{cases} |x - x| = |t - t_0|v \\ |x - x_1| = |t - t_1|v \\ |x - x_2| = |t - t_2|v \\ \vdots \\ |x - x_i| = |t - t_i|v \end{cases}$$

where (x, t) is the coordinate of the first fault point, x is a fault location on the trunk line, t is a fault occurrence moment, $(x_i, t_i)$ is the coordinates of the first monitoring points, $x_i$ is a coordinate location of a first monitoring point i on the trunk line, $t_i$ is the arrival moment of the traveling wave head corresponding to the first monitoring point i, and v is the traveling wave propagation speed from one to another of the monitoring points.

In a possible implementation, the branch line fault-locating equation includes:

$$\begin{cases} |x - x_0| + y = |t - t_0|v \\ |x - x_1| + y = |t - t_1|v \\ |x - x_2| + y = |t - t_2|v \\ \vdots \\ |x - x_i| + y = |t - t_i|v \\ |x - x_{j1}| + |y - y_{j1}| = |t - t_{j1}|v \\ |x - x_{(j-1)1}| + |y + y_{(j-1)1}| = |t - t_{(j-1)1}|v \\ \vdots \\ |x - x_{11}| + |y + y_{11}| = |t - t_{11}|v \end{cases}$$

where (x, y, t) is the coordinate of the second fault point, x is a fault location on the trunk line, t is a fault occurrence moment, y is a fault location on the branch line, $(x_{jn}, y_{jn}, t_{jn})$ is a coordinate of a second monitoring point n on a branch line j, $x_{jn}$ is a coordinate location of the second monitoring point n on the branch line j, $y_{jn}$ is the arrival moment of the second monitoring point n on the branch line j, $t_{jn}$ is a coordinate location of the second monitoring point i on the branch line j, and is v the traveling wave propagation speed from one to another of the monitoring points.

In a possible implementation, if the arrival moment collected by any of the traveling wave head monitoring sensors is not acquired, the trunk line fault-locating equation includes:

4

$$\begin{cases} (x - x_0)^2 = (t - t_0)^2 v^2 \\ (x - x_1)^2 = (t - t_1)^2 v^2 \\ (x - x_2)^2 = (t - t_2)^2 v^2 \\ \vdots \\ (x - x_i)^2 = (t - t_i)^2 v^2 \end{cases}$$

or $$\begin{cases} |x - x| = |t - t_0|v \\ |x - x_1| = |t - t_1|v \\ |x - x_2| = |t - t_2|v \\ \vdots \\ |x - x_i| = |t - t_i|v \end{cases}$$

where (x, t) is the coordinate of the first fault point, x is a fault location on the trunk line, t is a fault occurrence moment, $(x_{i-1}, t_{i-1})$ is the coordinates of the first monitoring points, $x_{i-1}$ is a coordinate location of a first monitoring point i−1 on the trunk line, $t_{i-1}$ is the arrival moment of the traveling wave head corresponding to the first monitoring point i−1, and v is the traveling wave propagation speed from one to another of the monitoring points.

In a possible implementation, the method further includes: arranging at least two traveling wave head monitoring sensors on the trunk line if the traveling wave propagation speed is known; and arranging at least three traveling wave head monitoring sensors on the trunk line if the traveling wave propagation speed is unknown.

To achieve the above object, a second aspect of the present disclosure provides a system for locating a fault of a complex power line, including: a locating host, and traveling wave head monitoring sensors arranged on the complex power line; wherein the locating host includes: a communication module, a data processing module, a locating calculation module, and an output display module; the communication module, the data processing module, the locating calculation module, and the output display module are electrically connected in sequence.

The traveling wave head monitoring sensor is used for monitoring a traveling wave of a voltage or a traveling wave of a current of the complex power line so as to obtain an arrival moment when a traveling wave head reaches each monitoring point, and the traveling wave head monitoring sensors correspond to the monitoring points on a one-to-one basis; the communication module is used for communicating with the traveling wave locating sensor, and acquiring the arrival moment of the traveling wave head and a traveling wave waveform; the data processing module is used for performing data processing on the arrival moment and traveling wave waveform, and outputting the data-processed arrival moment and traveling wave waveform to the locating calculation module; the locating calculation module is used for obtaining a coordinate of each monitoring point by using the arrival moment corresponding to each of the monitoring points and a line location of the monitoring point, and locating a fault by using coordinates of first monitoring points on the trunk line, a traveling wave propagation speed from one to another of the first monitoring points, and a trunk line fault-locating equation, so as to obtain a coordinate of a first fault point on the trunk line; determining whether a second fault point exists on the branch line by using the coordinate of the first fault point and a coordinate of a branch point corresponding to each branch line on the trunk line; locating a fault, if there is a second fault point on the branch line, by using the coordinate of the first fault point, the coordinates of the first monitoring points on the trunk line, coordinates of second monitoring points on the branch line, the traveling wave propagation speed from one to another of the first monitoring points, a traveling wave propagation speed from one to another of the second monitoring points, and a branch line fault-locating equation, so as to obtain a coordinate of the second fault point of the complex power line; and determining a target fault point on the complex power line according to the coordinate of the first fault point and the coordinate of the second fault point; the output display module is used for displaying each monitoring point and the coordinate of each monitoring point on the complex power line, the target fault point and a coordinate of the target fault point, and fault distance information.

To achieve the above object, a third aspect of the invention provides a computer-readable storage medium having stored thereon a computer program which, when executed by a processor, causes the processor to perform the steps of the first aspect or any possible implementation.

To achieve the above object, a fourth aspect of the invention provides a computer device including a memory and a processor, the memory storing a computer program which, when executed by the processor, causes the processor to perform the steps of the first aspect or any possible implementation.

The embodiments of the present disclosure render the following advantageous effects.

The present disclosure provides a method for locating a fault of a complex power line. With the method, several traveling wave head monitoring sensors are provided on a complex power line, and the traveling wave head monitoring sensors correspond to monitoring points on a one-to-one basis, so as to obtain several monitoring points on the complex power line; the complex power line is transformed into coordinates in conjunction with an arrival moment and a line location corresponding to the monitoring points, thereby establishing a trunk line fault-locating equation related to the line location, the arrival moment, and a traveling wave propagation speed; a first fault point can thus be derived simply and quickly; on the basis of a coordinate of the first fault point and a coordinate of a branch point corresponding to a branch line on the trunk line, a determination is made as to whether it is located on the branch line, and if it is located on the branch line, a branch line fault-locating equation related to the line location, the arrival moment, and the traveling wave propagation speed is established; a second fault point can thus be derived simply and quickly; finally, a target fault point of the complex power line can be obtained on the basis of the first fault point and the second fault point.

In theory, there is no dead zone in locating the fault, and it is not necessary to determine a fault section first; the equation is simple, and so is the locating principle. This method addresses the deficiency in double-ended traveling wave locating where the fault section needs to be determined first and the location accuracy is affected by a fixed light speed of the traveling wave; a locating path needs not to be planned again, and the wave speed can be calculated in real-time, hence the locating calculation is reliable and accurate.

BRIEF DESCRIPTION OF THE DRAWINGS

To explain the embodiments of the present disclosure or the technical solutions in the prior art more clearly, a brief description will be given below with reference to the accompanying drawings employed in the description of the embodiments or the prior art. Apparently, the drawings in the description below are merely some of the embodiments of the present disclosure, and it would be obvious for a person of ordinary skill in the art to obtain other drawings according to these drawings without involving any inventive effort.

In the drawings:

FIG. 2 is a schematic flowchart of a method for locating a fault of a complex power line according to an embodiment of the present disclosure;

FIG. 4 is another schematic flowchart of the method for locating a fault of a complex power line according to an embodiment of the present disclosure;

DESCRIPTION OF THE EMBODIMENTS

The embodiments of the present disclosure will now be described more fully hereinafter with reference to the accompanying drawings, in which embodiments of the invention are shown. It is to be understood that the embodiments described are only a few, but not all embodiments of the invention. Based on the embodiments of the present disclosure, all other embodiments obtained by a person of ordinary skill in the art without inventive effort fall within the scope of the present disclosure.

Figure 1:
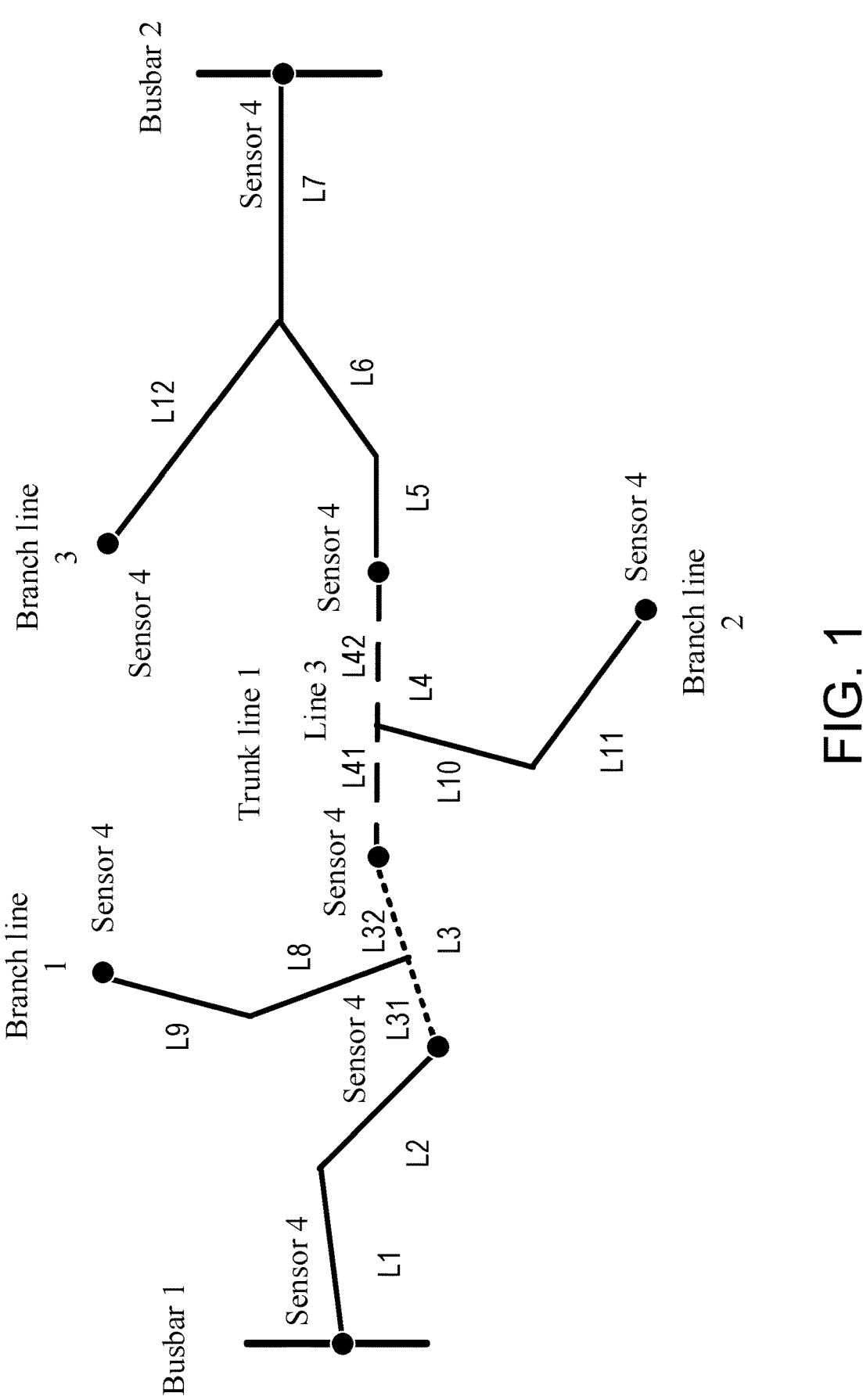
FIG. 1 is a schematic diagram of a complex power circuit according to an embodiment of the present disclosure.

With reference to FIG. 1, a schematic diagram of a complex power line according to an embodiment of the present disclosure, the complex power line herein is a crisscross power transmission line composed of various line types, such as a busbar, a trunk line, and a branch line. With reference to FIG. 1, the complex power line includes a busbar 1, a busbar 2, a trunk line 1, a branch line 1, a branch line 2, and a branch line 3, wherein traveling wave head monitoring sensors 4 are provided at head and tail ends of and along the trunk line 1, and the traveling wave head monitoring sensors 4 are provided at the tail ends of the branch line 1, the branch line 2, and the branch line 3. A provision location can be selected to be at a connection of cables and overhead lines of different types, a connection of two lines with different line diameters, and a section of a long power line where accurate locating is desirable; it needs to be noted that where and how many of the sensors are arranged can be determined as appropriate. With continued reference to FIG. 1, eight sensors 4 are provided in FIG. 1, and each of the traveling wave head monitoring sensors 4 is used for measuring an arrival moment when a wave head reaches a location (namely, a monitoring point) thereof, the arrival moments are respectively denoted as $t_0$, $t_1$, $t_2$, $t_3$, $t_4$, $t_{11}$, $t_{21}$, and $t_{31}$, which are also the arrival moment when the traveling wave head reaches each monitoring point. It will be appreciated that the power line shown in FIG. 1 is by way of example only and is not particularly limiting.

With continued reference to FIG. 2, a flowchart of a method for locating a fault of a complex power line according to an embodiment of the present disclosure is shown. The method shown in FIG. 2 includes the steps below.

In step 201, an arrival moment when a traveling wave head reaches a corresponding monitoring point is acquired as collected by several traveling wave head monitoring sensors on the complex power line, wherein the traveling wave head monitoring sensors are arranged on a trunk line and a branch line of the complex power line, and the traveling wave head monitoring sensors correspond to the monitoring points on a one-to-one basis.

It should be noted that the traveling wave head monitoring sensor is used for collecting waveform information about a traveling wave, including but not limited to the arrival moment when the traveling wave head reaches the corresponding monitoring point and a waveform of the traveling wave. In this embodiment, the traveling wave head monitoring sensors are separately arranged on the complex power line, that is, it is necessary to arrange the traveling wave head monitoring sensors on a multi-branch complex power line so as to record the moments when the traveling wave head reaches the monitoring points; with continued reference to the example of FIG. 1, a number of the sensors may be eight, and the sensors are respectively arranged on the trunk line 1, the branch line 1, and the branch line 2. It will be appreciated that more monitoring points may be provided for a more complex power line or different fault detection requirements, that is, the number of the sensors may be greater, and the examples here are not intended to be limiting. The fault occurrence moment and the arrival moment when the traveling wave head reaches the traveling wave head sensor are shown in a 24-hour or 12-hour clock, converted into microseconds or nanoseconds.

In step 202, coordinates corresponding to all the monitoring points in a target coordinate system corresponding to the complex power line are acquired, wherein an origin of coordinates of the target coordinate system is any point on the trunk line, the coordinates include a line location and an arrival moment corresponding to a monitoring point, and the line location includes a location on the trunk line and a location on the branch line.

Furthermore, it is also necessary to acquire the coordinates of all the monitoring points in the target coordinate system corresponding to the complex power line, wherein the coordinates can reflect the line location of each monitoring point in the complex power line; the target coordinate system is established on the basis of the line location and the arrival moment; the origin of coordinates of the target coordinate system is any point on the trunk line; once the origin of the coordinates is determined, the whole power line can be transformed into coordinates along the trunk line; preferably, the origin of coordinates can be the head end of the trunk line; the trunk line takes the monitoring point at the head end of the line as the origin of coordinates, that is, $x_0=0$, and lengths from the monitoring points along the line to the head end are $L_1, L_2, L_3, \ldots, L_i$, respectively, where i is a serial number of all the monitoring points 0, 1, 2, 3, . . . , i, and $x_i=L_i$. As a result, the location on the trunk line of each monitoring point is the corresponding line length, and a coordinate array on a horizontal axis X is $(x_0, x_1, x_2, x_3, \ldots, x_i)$. Furthermore, the branch line is transformed into coordinates by taking an intersection point of the trunk line and the branch line as a starting point, and deriving coordinate arrays $(x_{11}, y_{11}), (x_{21}, y_{21}), \ldots, (x_{j1}, y_{j1}), \ldots, (x_{jn}, y_{jn})$ of the traveling wave head monitoring sensors on the branch line, where j is a j-th branch line, and n is an n-th sensor on the j-th branch line.

Figure 3:
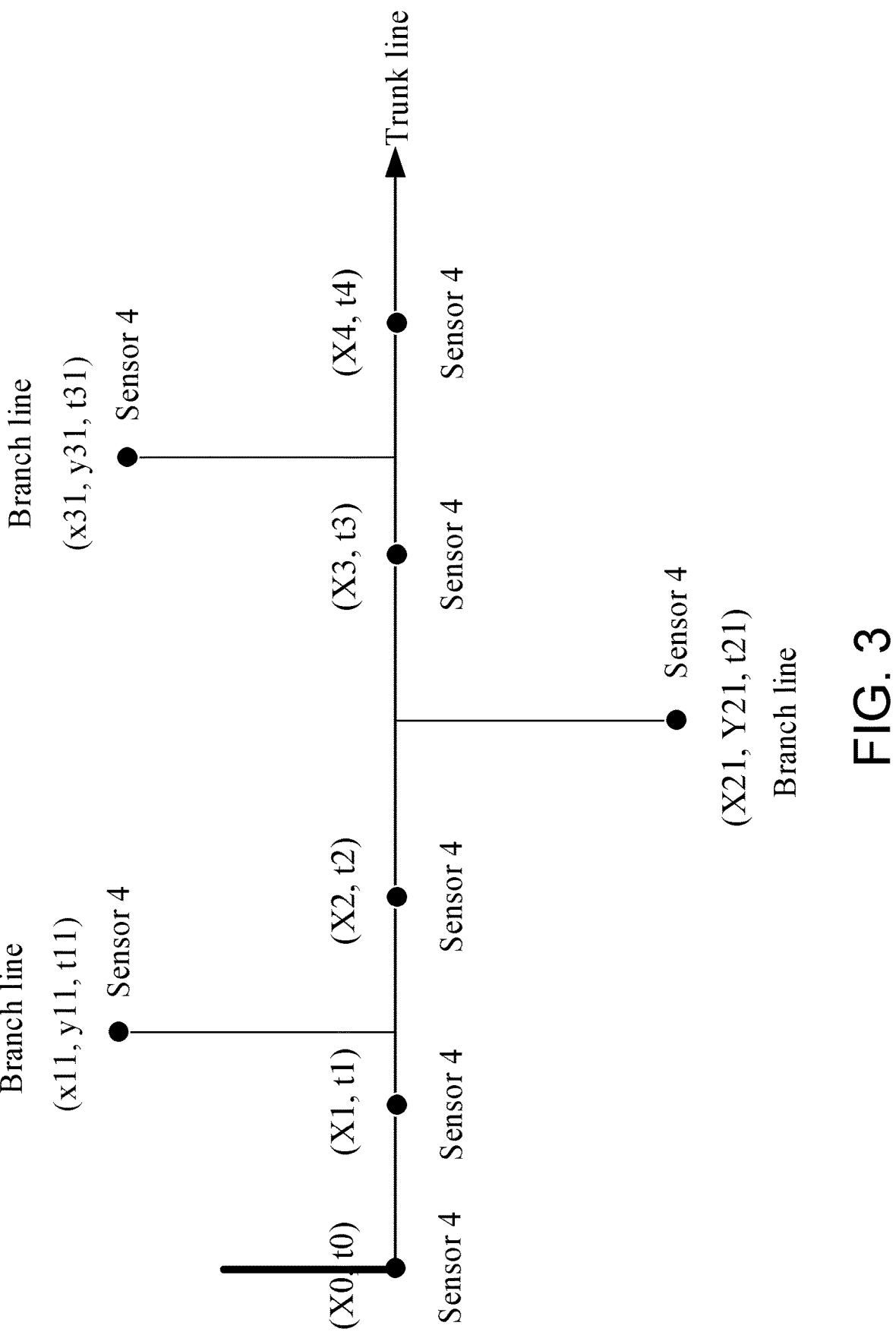
FIG. 3 is a schematic diagram of a target coordinate system corresponding to a complex power line according to an embodiment of the present disclosure.

By way of example, with reference to FIG. 3 and in conjunction with FIG. 1, a method for establishing the target coordinate system is described, wherein FIG. 3 is a schematic diagram of the target coordinate system corresponding to the complex power line in an embodiment of the present disclosure; the lengths $L_1, L_2, L_3, L_4, L_5, L_6$ and $L_7$ of each traveling wave monitoring sensor 4 of the power line along the trunk line 1 are obtained, and the coordinate of the point is $(x_0, t_0)$ assuming that the sensor at the busbar 1 end is the origin of coordinates, $x_0=0$, and $t_0$ is the moment when a fault traveling wave head reaches the sensor; the coordinate locations of all the line wave head monitoring sensors arranged along the trunk line are $(x_1, t_1), (x_2, t_2), (x_3, t_3)$, and $(x_4, t_4)$, where $x_1=L_1+L_2$, $x_2=L_1+L_2+L_3$, $x_3=L_1+L_2+L_3+L_4$, $x_4=L+L_2+L_3+L_4+L_5+L_6+L_7$, and $t_1, t_2, t_3$, and $t_4$ are the moments when the traveling wave head reaches the sensors, respectively.

Furthermore, the branch line 1, the branch line 2, and the branch line 3 are transformed into coordinates, and the coordinate locations of all the line wave head monitoring sensors arranged on the branch line are denoted as $(x_{11}, y_{11}, t_{11})$ where $x_{11}=L_1+L_2+L_{31}$, and $y_{11}=L_8+L_9$, $(x_{21}, y_{21}, t_{21})$ where $x_{21}=L_1+L_2+L_3+L_{41}$, and $y_{21}=L_{10}+L_{11}$, and $(x_{31}, y_{31}, t_{31})$, where $x_{31}=L_1+L_2+L_3+L_4+L_5+L_6$, and $y_{31}=L_{12}$; $t_{11}, t_{21}$, and $t_{31}$ are the moments when the traveling wave head reaches the sensors, respectively. Through the transformation to coordinates, the target coordinate system corresponding to the complex power line can be obtained. It can be understood that the location on the trunk line is denoted by x and the location on the branch line is denoted by y. Thus, the coordinates of the monitoring points on the trunk line can be $(x_{jn}, y_{jn}, t_{jn})$, and the coordinates of the monitoring points on the branch line can be $(x_{jn}, y_{jn}, t_{jn})$, where $x_i$ is the location on the trunk line of a monitoring point i on the trunk line, $t_i$ is the arrival moment of the monitoring point i on the trunk line, $x_{jn}$ is the location on the trunk line of a monitoring point n on a branch line j, $y_{jn}$ is the location on the branch line of the monitoring point n on the branch line j, $t_{jn}$ is the arrival moment of the monitoring point n on the branch line j.

In step 203, a fault is located by using coordinates of first monitoring points on the trunk line, a traveling wave propagation speed from one to another of the first monitoring points, and a trunk line fault-locating equation, so as to obtain a coordinate of a first fault point on the trunk line.

In this embodiment, the fault can be located by using the coordinates $(x_i, t_i)$ of the first monitoring points on the trunk line, the traveling wave propagation speed from one to another of all the first monitoring points, and the trunk line fault-locating equation, so as to obtain the coordinate of the first fault point on the trunk line, wherein the fault locating is a process of searching for the first fault point on the trunk line, and can be understood as a process of solving the trunk line fault-locating equation so as to obtain the coordinate of the first fault point. Herein, the trunk line fault-locating equation is established on the basis of the traveling wave propagation relationship among all the monitoring points, for example, an equation related to a displacement and duration of the traveling wave propagation and the traveling wave propagation speed, hence the coordinate of the possible first fault point can be derived from the trunk line fault-locating equation to realize fault locating. It is to be understood that the coordinates of the first monitoring points on the trunk line can be $(x_i, t_i)$, and thus the coordinate of the first fault point can be (X t), where the traveling wave propagation speed from one to another of all the first monitoring points can be v.

In step 204, a determination is made as to whether a second fault point exists on the branch line by using the coordinate of the first fault point and a coordinate of a branch point corresponding to each branch line on the trunk line.

Furthermore, a traveling wave fault on the trunk line included in the complex power line may also be caused by a branch line traveling wave fault, and therefore it is necessary to determine whether there is a fault on the branch line. Specifically, a determination is made as to whether there is a second fault point on the branch line by using the coordinate of the first fault point and the coordinate of the branch point corresponding to each branch line on the trunk line. It can be understood that each branch line branches off from the trunk line, and therefore there is an intersection point for both the branch line and the trunk line, and the intersection point can be referred to as the branch point. For example, a determination is made as to whether the second fault point exists on the branch line by determining whether the line location included in the coordinate of the first fault point is the same as the line location corresponding to the branch point, and if so, the second fault point exists on the branch line; if not, there is no second fault point on the branch line.

Note that if there is no second fault point on the branch line, then a target fault point can be derived from the coordinate of the first fault point. If there is a second fault point on the branch line, the method proceeds to step 205.

In step 205, a fault is located, if there is a second fault point on the branch line, by using the coordinate of the first fault point, the coordinates of the first monitoring points on the trunk line, coordinates of second monitoring points on the branch line, the traveling wave propagation speed from one to another of the first monitoring points, a traveling wave propagation speed from one to another of the second monitoring points, and a branch line fault-locating equation, so as to obtain a coordinate of the second fault point of the complex power line.

It can be understood that if there is a second fault point on the branch line, it is necessary to continue to determine the coordinate of the second fault point on the branch line. Specifically, the fault is located by using the coordinate of the first fault point, the coordinates of the first monitoring points on the trunk line, the coordinates of the second monitoring points on the branch line, the traveling wave propagation speed from one to another of the first monitoring points, the traveling wave propagation speed from one to another of the second monitoring points, and the branch line fault-locating equation, so as to obtain the coordinate of the second fault point of the complex power line. Herein, the branch line fault-locating equation is established on a traveling wave propagation relationship among all the monitoring points, for example, an equation related to a displacement and duration of the traveling wave propagation and the traveling wave propagation speed, hence the coordinate of the possible second fault point can be derived from the branch line fault-locating equation to realize fault locating. The coordinate of the second fault point can be (x, y, t), and the coordinates of the second monitoring points can be $(x_{jn}, y_{jn}, t_{jn})$.

In step 206, a target fault point on the complex power line is determined according to the coordinate of the first fault point and the coordinate of the second fault point.

The present disclosure provides a method for locating a fault of a complex power line. With the method, several traveling wave head monitoring sensors are provided on a complex power line, and the traveling wave head monitoring sensors correspond to monitoring points on a one-to-one basis, so as to obtain several monitoring points on the complex power line; the complex power line is transformed into coordinates in conjunction with an arrival moment and a line location corresponding to the monitoring points, thereby establishing a trunk line fault-locating equation related to the line location, the arrival moment, and a traveling wave propagation speed; a first fault point can thus be derived simply and quickly; on the basis of a coordinate of the first fault point and a coordinate of a branch point corresponding to a branch line on the trunk line, a determination is made as to whether it is located on the branch line, and if it is located on the branch line, a branch line fault-locating equation related to the line location, the arrival moment, and the traveling wave propagation speed is established; a second fault point can thus be derived simply and quickly; finally, a target fault point of the complex power line can be obtained on the basis of the first fault point and the second fault point.

In theory, there is no dead zone in locating the fault, and it is not necessary to determine a fault section first; the equation is simple, and so is the locating principle. This method addresses the deficiency in double-ended traveling wave locating where the fault section needs to be determined first and the location accuracy is affected by a fixed light speed of the traveling wave; a locating path needs not to be planned again, and the wave speed can be calculated in real-time, hence the locating calculation is reliable and accurate.

With reference to FIG. 4, FIG. 4 is another flow diagram of the method for locating a fault of a complex power line according to an embodiment of the present disclosure, and the method as shown in FIG. 4 includes the steps below.

In step 401, an arrival moment when a traveling wave head reaches a corresponding monitoring point is acquired as collected by several traveling wave head monitoring sensors on the complex power line, wherein the traveling wave head monitoring sensors are arranged on a trunk line and a branch line of the complex power line, and the traveling wave head monitoring sensors correspond to the monitoring points on a one-to-one basis.

In step 402, coordinates corresponding to all the monitoring points in a target coordinate system corresponding to the complex power line are acquired, wherein an origin of coordinates of the target coordinate system is any point on the trunk line, the coordinates include a line location and an arrival moment corresponding to a monitoring point, and the line location includes a location on the trunk line and a location on the branch line.

It should be noted that steps 401 and 402 are similar to steps 201 and 202 shown in FIG. 2, and for brevity, the description will not be repeated here, and specific reference will be made to the description of steps 201 and 202 above.

In step 403, a trunk line fault-locating equation group is established by using the coordinates of all the first monitoring points, the traveling wave propagation speed from one to another of the first monitoring points, and the trunk line fault-locating equation.

In a possible implementation, the location on the trunk line of the fault is x and the fault occurrence moment is t, and a distance of $(x-x_i)$ is derived to be $(t_i-t)v$, hence the trunk line fault-locating equation can be as follows:

$$\begin{cases} (x - x_0)^2 = (t - t_0)^2 v^2 \\ (x - x_1)^2 = (t - t_1)^2 v^2 \\ (x - x_2)^2 = (t - t_2)^2 v^2 \\ \vdots \\ (x - x_i)^2 = (t - t_i)^2 v^2 \end{cases}$$

or $$\begin{cases} |x - x| = |t - t_0| v \\ |x - x_1| = |t - t_1| v \\ |x - x_2| = |t - t_2| v, \\ \vdots \\ |x - x_i| = |t - t_i| v \end{cases}$$

where (x, t) is the coordinate of the first fault point, x is a fault location on the trunk line, t is a fault occurrence moment, $(x_i, t_i)$ is the coordinates of the first monitoring points, $x_i$ is a coordinate location of a first monitoring point i on the trunk line, $t_i$ is the arrival moment of the traveling wave head corresponding to the first monitoring point i, and v is the traveling wave propagation speed from one to another of the monitoring points.

It is to be noted that if the traveling wave propagation speed is known, at least two traveling wave head monitoring sensors are arranged on the trunk line; if the traveling wave propagation speed is unknown, at least three traveling wave head monitoring sensors are arranged on the trunk line, to ensure that the equations can be solved to achieve fault locating.

In a possible implementation, if the arrival moment collected by any of the traveling wave head monitoring sensors is not acquired, that is, if any sensor fails or otherwise results in a failure to acquire the arrival moment, then the trunk line fault-locating equation includes:

$$\begin{cases} (x - x_0)^2 = (t - t_0)^2 v^2 \\ (x - x_1)^2 = (t - t_1)^2 v^2 \\ (x - x_2)^2 = (t - t_2)^2 v^2 \\ \vdots \\ (x - x_{i-1})^2 = (t - t_{i-1})^2 v^2 \end{cases}$$

or $$\begin{cases} |x - x| = |t - t_0| v \\ |x - x_1| = |t - t_1| v \\ |x - x_2| = |t - t_2| v \\ \vdots \\ |x - x_{i-1}| = |t - t_{i-1}| v \end{cases},$$

where (x, t) is the coordinate of the first fault point, x is a fault location on the trunk line, t is a fault occurrence moment, $(x_{i-1}, t_{i-1})$ is the coordinates of the first monitoring points, $x_{i-1}$ is a coordinate location of a first monitoring point i−1 on the trunk line, $t_{i-1}$ is the arrival moment of the traveling wave head corresponding to the first monitoring point i−1, and v is the traveling wave propagation speed from one to another of the monitoring points. That is, even in the absence of data from any sensor, the fault-locating equation can still be established. That is, a number of equations in the equation group is positively related to a number of sensors that are operating properly.

In step 404, a determination is made as to whether the first fault point exists on the trunk line by using the propagation speed from one to another of the first monitoring points in a solution of the trunk line fault-locating equation group.

In step 405, a determination is made as to the coordinate of the first fault point according to the propagation speed from one to another of the first monitoring points if the first fault point exists on the trunk line.

Figure 5:
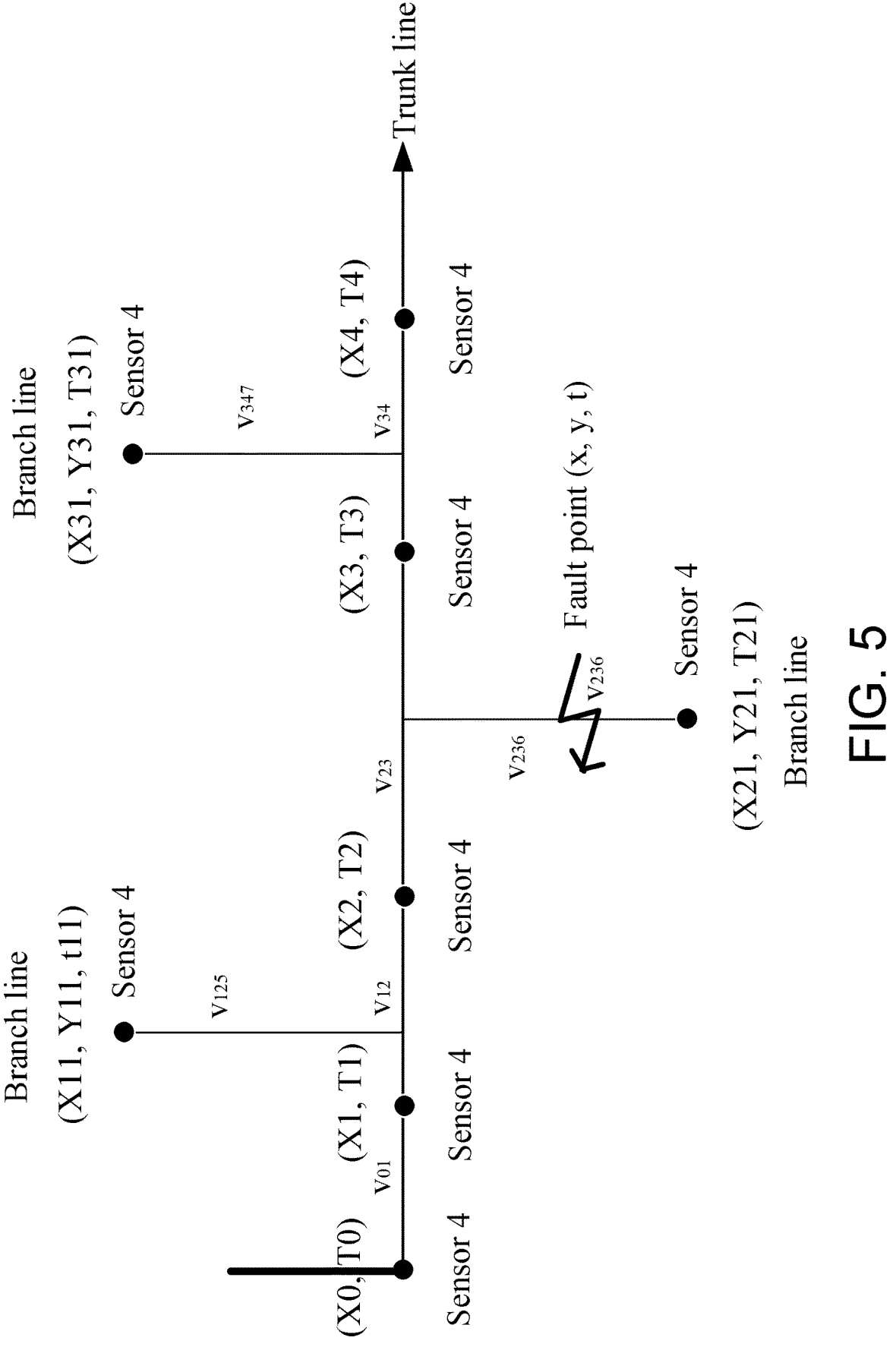
FIG. 5 is a schematic diagram of a target coordinate system of a complex power line including a target fault point according to an embodiment of the present disclosure.

With reference to FIG. 5, FIG. 5 is a schematic diagram of a target coordinate system of a complex power line including a target fault point according to an embodiment of the present disclosure, and the trunk line fault-locating equation group of the trunk line included in the complex power line shown in FIG. 5 may be as follows:

$$\begin{cases} |x - x| = |t - t_0| v \\ |x - x_1| = |t - t_1| v \\ |x - x_2| = |t - t_2| v. \\ |x - x_3| = |t - t_3| v \\ |x - x_4| = |t - t_4| v \end{cases}$$

By way of example, a process of deriving the first fault point in steps 403, 404, and 405 in this embodiment is described with reference to FIG. 5 below.

A line section of the trunk line where the fault is located is assumed at first, and a trunk line fault-locating equation (a distributed fault-locating equation group) is solved to derive a location coordinate of the fault point on the trunk line, wherein the line section of the trunk line is composed of various monitoring points, and a power line between adjacent monitoring points is one line section; as shown in FIG. 5, the line sections include $\{[x_0\text{-}x_1], [x_1\text{-}x_2], [x_2\text{-}x_3]$ and $[x_3\text{-}x_4]\}$; assuming that a fault occurs between $x_2$ and $x_3$, and the sensors all work normally, without lack of sensor data, the steps for solving the trunk line fault-locating equation are described below.

1) Let the fault point occur between $x_0$ and $x_1$, and all the fault-locating equations when all the traveling wave head sensors are in a normal state can be transformed into the following form to be solved.

$$\begin{cases} x - x_0 = (t_0 - t) v & (0) \\ x_1 - x = (t_1 - t) v & (1) \\ x_2 - x = (t_2 - t) v & (2) \\ x_3 - x = (t_3 - t) v & (3) \\ x_4 - x = (t_4 - t) v & (4) \end{cases}$$

Fault-Locating Equation Group (a)

From Equation (0) and Equation (1) it follows that: a first fault point is $$x_{01} = \frac{v(t_0 - t_1) + (x_0 + x_1)}{2};$$

From Equation (0) and Equation (2) it follows that: a first fault point is $$x_{02} = \frac{v(t_0 - t_2) + (x_0 + x_2)}{2};$$

From Equation (0) and Equation (3) it follows that: a first fault point is $$x_{03} = \frac{v(t_0 - t_3) + (x_0 + x_3)}{2};$$

From Equation (0) and Equation (4) it follows that: a first fault point is $$x_{04} = \frac{v(t_0 - t_4) + (x_0 + x_4)}{2};$$

From Equation (1) and Equation (2) it follows that: the traveling wave propagation speed from one to another of the monitoring points 1 and 2 is $$v_{12} = \frac{x_1 - x_2}{t_1 - t_2};$$

From Equation (1) and Equation (3) it follows that: the traveling wave propagation speed from one to another of the monitoring points 1 and 3 is $$v_{13} = \frac{x_1 - x_3}{t_1 - t_3};$$

From Equation (1) and Equation (4) it follows that: the traveling wave propagation speed from one to another of the monitoring points 1 and 4 is $$v_{14} = \frac{x_1 - x_4}{t_1 - t_4};$$

From Equation (2) and Equation (3) it follows that: the traveling wave propagation speed from one to another of the monitoring points 2 and 3 is $$v_{23} = \frac{x_2 - x_3}{t_2 - t_3};$$

From Equation (2) and Equation (4) it follows that: the traveling wave propagation speed from one to another of the monitoring points 2 and 4 is $$v_{24} = \frac{x_2 - x_4}{t_2 - t_4};$$

From Equation (3) and Equation (4) it follows that: the traveling wave propagation speed from one to another of the monitoring points 3 and 4 is $$v_{34} = \frac{x_3 - x_4}{t_3 - t_4}.$$

In summary, substituting the line location and the arrival moment into the expression of the traveling wave propagation speed to obtain a solution of each traveling wave propagation speed, i.e., $v_{21}$, $v_{13}$, $v_{14}$, $v_{23}$, $v_{24}$, and $v_{34}$, and each first fault point is derived with the resultant traveling wave propagation speed as a known value; if the fault point x is not between $x_0$ and $x_1$, the fault-locating equation group (a) cannot be used to solve the location coordinate of the fault point x. It is to be noted that, since it is necessary to use the resultant traveling wave propagation speed as a known value to substitute into an equation for deriving each first fault point, if the derived first fault point is for sure not within a range of line locations of the monitoring points, it can be then determined that there is no fault point coordinate x in the range of line locations of the monitoring points.

2) Further, let the fault point occur between $x_1$ and $x_2$ the fault-locating equation when all the traveling wave head monitoring sensors are in the normal state can be transformed into the following form:

$$\begin{cases} x - x_0 = (t_0 - t)\,v & (0) \\ x - x_1 = (t_1 - t)\,v & (1) \\ x_2 - x = (t_2 - t)\,v & (2) \\ x_3 - x = (t_3 - t)\,v & (3) \\ x_4 - x = (t_4 - t)\,v & (4) \end{cases}$$

Fault-Locating Equation Group (b)
From Equation (0) and Equation (1) it follows that:

$$v_{01} = \frac{x_1 - x_0}{t_0 - t_1};$$

From Equation (0) and Equation (2) it follows that: a first fault point is $$x_{02} = \frac{v(t_0 - t_2) + (x_0 + x_2)}{2};$$

From Equation (0) and Equation (3) it follows that: a first fault point is $$x_{03} = \frac{v(t_0 - t_3) + (x_0 + x_3)}{2};$$

From Equation (0) and Equation (4) it follows that: a first fault point is $$x_{04} = \frac{v(t_0 - t_4) + (x_0 + x_4)}{2};$$

From Equation (1) and Equation (2) it follows that: a first fault point $$x_{12} = \frac{v(t_1 - t_2) + (x_1 + x_2)}{2};$$

From Equation (1) and Equation (3) it follows that: a first fault point is $$x_{13} = \frac{v(t_1 - t_3) + (x_1 + x_3)}{2};$$

From Equation (1) and Equation (4) it follows that: a first fault point is $$x_{14} = \frac{v(t_1 - t_4) + (x_1 + x_4)}{2};$$

From Equation (2) and Equation (3) it follows that:

$$v_{23} = \frac{x_2 - x_3}{t_2 - t_3};$$

From Equation (2) and Equation (4) it follows that:

$$v_{24} = \frac{x_2 - x_4}{t_2 - t_4};$$

From Equation (3) and Equation (4) it follows that:

$$v_{34} = \frac{x_3 - x_4}{t_3 - t_4}.$$

Each first fault point is derived with the resultant traveling wave propagation speed as a known value; if the fault point x is not between $x_1$ and $x_2$ the fault-locating equation group (b) cannot be used to solve the location coordinate of the fault point x.

3) Let the fault point occur between $x_2$ and $x_3$, the fault-locating equation when all the traveling wave head sensors are in the normal state can be transformed into the following form:

$$\begin{cases} x - x_0 = (t_0 - t)v(0) \\ x - x_1 = (t_1 - t)v(1) \\ x - x_2 = (t_2 - t)v(2) \\ x_3 - x = (t_3 - t)v(3) \\ x_4 - x = (t_4 - t)v(4) \end{cases}$$

Fault-Locating Equation Group (c)

From Equation (0) and Equation (1) it follows that:

$$v_{01} = \frac{x_1 - x_0}{t_0 - t_1};$$

From Equation (0) and Equation (2) it follows that:

$$v_{02} = \frac{x_2 - x_0}{t_0 - t_2};$$

From Equation (0) and Equation (3) it follows that: A first fault point is $$x_{03} = \frac{v(t_0 - t_3) + (x_0 + x_3)}{2};$$

From Equation (0) and Equation (4) it follows that: A first fault point is $$x_{04} = \frac{v(t_0 - t_4) + (x_0 + x_4)}{2};$$

From Equation (1) and Equation (2) it follows that:

$$v_{12} = \frac{x_2 - x_1}{t_1 - t_2};$$

From Equation (1) and Equation (3) it follows that: a first fault point is $$x_{13} = \frac{v(t_1 - t_3) + (x_1 + x_3)}{2};$$

From Equation (1) and Equation (4) it follows that: a first fault point is $$x_{14} = \frac{v(t_1 - t_4) + (x_1 + x_4)}{2};$$

From Equation (2) and Equation (3) it follows that: a first fault point is $$x_{23} = \frac{v(t_2 - t_3) + (x_2 + x_3)}{2};$$

From Equation (2) and Equation (4) it follows that: a first fault point is $$x_{24} = \frac{v(t_2 - t_4) + (x_2 + x_4)}{2};$$

From Equation (3) and Equation (4) it follows that:

$$v_{34} = \frac{x_3 - x_4}{t_3 - t_4}.$$

Each first fault point is derived with the resultant traveling wave propagation speed as a known value; if the fault point x is between $x_2$ and $x_3$, then the fault-locating equation group (c) can be used to solve the location coordinate of the fault point x.

Furthermore, if the complex power line is a pure overhead line, then $v_{01}=v_{02}=v_{12}=v_{34}=3\times10^8$ m/s and the traveling wave propagation speed is substituted into $$x_{03} = \frac{v(t_0 - t_3) + (x_0 + x_3)}{2},$$

$$x_{04} = \frac{v(t_0 - t_4) + (x_0 + x_4)}{2},$$

$$x_{13} = \frac{v(t_1 - t_3) + (x_1 + x_3)}{2},$$

$$x_{14} = \frac{v(t_1 - t_4) + (x_1 + x_4)}{2},$$

$$x_{23} = \frac{v(t_2 - t_3) + (x_2 + x_3)}{2},$$

and $$x_{24} = \frac{v(t_2 - t_4) + (x_2 + x_4)}{2}$$

to solve the first fault points $x_{03}$, $x_{04}$, $x_{13}$, $x_{14}$, $x_{23}$, and $x_{24}$. If the complex power line is not a pure overhead line, the coordinates of the monitoring points, including the line location and the arrival moment, can be substituted into a speed expression to obtain a corresponding speed value, and the resultant speed value is substituted into the expression of the first fault point to solve the coordinate of the first fault point.

A horizontal ordinate of the location of first fault point on the trunk line is derived comprehensively.

The horizontal ordinate x of the first fault point on the trunk line is calculated by using $x_{03}$, $x_{04}$, $x_{13}$, $x_{14}$, $x_{23}$, and $x_{24}$ in conjunction with optimization algorithms such as the least squares method, mean value method, variance method, and mathematical expectation method.

By way of example, the horizontal ordinate of the line fault point calculated by using the mean value method may be based on the following equation:

$$x = \frac{x_{03} + x_{04} + x_{13} + x_{14} + x_{23} + x_{24}}{6}.$$

It should be noted that the above example is based on the case where all the sensors operate normally, that is to say, the sensor data is not missing. If there is any sensor data missing and it is assumed that the traveling wave sensor lacks the arrival moment $t_3$ of the traveling wave head, then the above trunk line fault-locating equation group of the complex power line shown in FIG. 5 can be organized as:

$$\begin{cases} |x - x_0| = |t - t_0|v \\ |x - x_1| = |t - t_1|v \\ |x - x_2| = |t - t_2|v \\ |x - x_4| = |t - t_4|v \end{cases}.$$

In step 406, a determination is made as to whether a second fault point exists on the branch line by using the coordinate of the first fault point and a coordinate of a branch point corresponding to each branch line on the trunk line.

In step 407, a fault is located, if there is a second fault point on the branch line, by using the coordinate of the first fault point, the coordinates of the first monitoring points on the trunk line, coordinates of second monitoring points on the branch line, the traveling wave propagation speed from one to another of the first monitoring points, a traveling wave propagation speed from one to another of the second monitoring points, and a branch line fault-locating equation, so as to obtain a coordinate of the second fault point of the complex power line.

It should be noted that step 407 is similar to step 205 shown in FIG. 2, and for brevity, no further description thereof will be provided herein; reference can be made to the description of step 205 above for details.

Specifically, step 407 may include: establishing a branch line fault-locating equation group, if there is a second fault point on the branch line, by using the coordinate of the first fault point, the coordinates of the first monitoring points on the trunk line, the coordinates of the second monitoring points on the branch line, the traveling wave propagation speed from one to another of the first monitoring points, the traveling wave propagation speed from one to another of the second monitoring points, and the branch line fault-locating equation, so as to determine the coordinate of the second fault point.

In a possible implementation, the branch line fault-locating equation may be as follows:

$$\begin{cases} |x - x_0| + y = |t - t_0|v \\ |x - x_1| + y = |t - t_1|v \\ |x - x_2| + y = |t - t_2|v \\ \vdots \\ |x - x_i| + y = |t - t_i|v \\ |x - x_{j1}| + |y - y_{j1}| = |t - t_{j1}|v \\ |x - x_{(j-1)1}| + |y + y_{(j-1)1}| = |t - t_{(j-1)1}|v \\ \vdots \\ |x - x_{11}| + |y + y_{11}| = |t - t_{11}|v \end{cases},$$

where $(x, y, t)$ is the coordinate of the second fault point, x is a fault location on the trunk line, t is a fault occurrence moment, y is a fault location on the branch line, $(x_{jn}, y_{jn}, t_{jn})$ is a coordinate of a second monitoring point n on a branch line j, $x_{jn}$ is a coordinate location of the second monitoring point n on the branch line j, $t_{jn}$ is the arrival moment of the second monitoring point n on the branch line j, $y_{jn}$ is a coordinate location of the second monitoring point i on the branch line j, and is v the traveling wave propagation speed from one to another of the monitoring points. Note that since one traveling wave head monitoring sensor is provided on the branch line in FIG. 5, only one second monitoring point exists, $(x_{j1}, y_{j1}, t_{j1})$ in the equation is the coordinate of the second monitoring point 1 on the branch line j, and is also the coordinate of the 1st second monitoring point on the branch line j.

The description of steps 406 and 407 continues with reference to FIG. 5 in conjunction with the above process of solving the first fault point, wherein the horizontal ordinate of the first fault point x occurring between $x_2$ and $x_3$ is derived in step 405, and if the horizontal ordinate of the second fault point is $x \approx x_{21} = L_1 + L_2 + L_3 + L_{41}$, then the horizontal ordinate of the second fault point is close to the branch point coordinate corresponding to the branch line 2; therefore, the fault point may also be located on the branch line 2, and locating the fault point needs further calculation.

4) Let the fault point be located on the branch line 2, x is a horizontal ordinate of the second fault point derived in step 405, and thus the location coordinate of the fault point is $(x, y, t)$, and the fault-locating equation is organized as follows:

$$\begin{cases} x - x_0 + y = (t_0 - t)v & (0) \\ x - x_1 + y = (t_1 - t)v & (1) \\ x - x_2 + y = (t_2 - t)v & (2) \\ x_3 - x + y = (t_3 - t)v & (3) \\ x_4 - x + y = (t_4 - t)v & (4) \\ x - x_{11} + y + y_{11} = (t_{11} - t)v & (5) \\ x - x_{21} + y_{21} - y = (t_{21} - t)v & (6) \\ x_{31} - x + y + y_{31} = (t_{31} - t)v & (7) \end{cases}$$

From Equation (0) and Equation (6) it follows that: a second fault point is $$y = \frac{(t_0 - t_{21})v + x_0 - x_{21} + y_{21}}{2};$$

From Equation (1) and Equation (6) it follows that: a second fault point is $$y = \frac{(t_1 - t_{21})v + x_1 - x_{21} + y_{21}}{2};$$

From Equation (2) and Equation (6) it follows that: a second fault point is $$y = \frac{(t_2 - t_{21})v + x_2 - x_{21} + y_{21}}{2};$$

From Equation (3) and Equation (6) it follows that: a second fault point is $$y = \frac{(t_3 - t_{21})v + x_3 - x_{21} + y_{21}}{2};$$

From Equation (4) and Equation (6) it follows that: a second fault point is $$y = \frac{(t_4 - t_{21})v + x_4 - x_{21} + y_{21}}{2};$$

From Equation (5) and Equation (6) it follows that: a second fault point is $$y = \frac{(t_{11} - t_{21})v + x_{11} - y_{11} - x_{21} + y_{21}}{2};$$

From Equation (7) and Equation (6) it follows that: a second fault point is $$y = \frac{(t_{31} - t_{21})v + 2x - x_{31} - y_{31} - x_{21} + y_{21}}{2};$$

From Equation (0) and Equation (1) it follows that:

$$v_{01} = \frac{x_1 - x_0}{t_0 - t_1};$$

From Equation (1) and Equation (2) it follows that:

$$v_{12} = \frac{x_2 - x_1}{t_1 - t_2};$$

From Equation (2) and Equation (3) it follows that:

$$v_{23} = \frac{2x - x_2 - x_3}{t_2 - t_3};$$

From Equation (3) and Equation (4) it follows that:

$$v_{34} = \frac{x_4 - x_3}{t_3 - t_4};$$

Furthermore, if it is a pure overhead line $v_0 = v_{12} = v_{34} = v_{236} = v_{125} = v_{347}$, then $v = v_{01} = v_{12} = v_{23} = v_{34} = v_{236} = v_{125} = v_{347}$, and the location coordinate of each traveling wave head monitoring sensor and the arrival moment of the traveling wave head are substituted into the following equations:

$$y = \frac{(t_0 - t_{21})v + x_0 - x_{21} + y_{21}}{2};$$

$$y = \frac{(t_1 - t_{21})v + x_1 - x_{21} + y_{21}}{2};$$

$$y = \frac{(t_2 - t_{21})v + x_2 - x_{21} + y_{21}}{2};$$

$$y = \frac{(t_3 - t_{21})v + x_3 - x_{21} + y_{21}}{2};$$

$$y = \frac{(t_4 - t_{21})v + x_4 - x_{21} + y_{21}}{2};$$

$$y = \frac{(t_{11} - t_{21})v + x_{11} - y_{11} - x_{21} + y_{21}}{2};$$

$$y = \frac{(t_{31} - t_{21})v + 2x - x_{31} - y_{31} - x_{21} + y_{21}}{2}.$$

The coordinate values of y for the seven second fault points are solved, and are denoted as $y_1$, $y_2$, $y_3$, $y_4$, $y_5$, $y_6$, and $y_7$.

The coordinate y of an accurate fault point location of the second fault point is calculated by using $y_1$, $y_2$, $y_3$ $y_4$, $y_5$, $y_6$, and $y_7$ in conjunction with methods such as the least squares method, mean value method, variance method, and mathematical expectation method. For example, if the mean value method is used, the accurate location of the line fault point is:

$$y = \frac{y_1 + y_2 + y_3 + y_4 + y_5 + y_6 + y_7}{7},$$

the accurate location coordinate of the fault point is then (x, y), where x is derived in step 405, r is derived in step 407, and the fault point is at a location indicated by the location coordinate x on the line sections $L_{41}$ and $L_{42}$, or at a location indicated by the location coordinate y on the line sections $L_{10}$ and $L_{11}$.

If the power line is a hybrid line, and the wave speeds of each section are not equal, that is, $v \neq v_{01} \neq v_{12} \neq v_{23} \neq v_{34} \neq v_{236} \neq v_{125} \neq v_{347}$, then $v_{01}$, $v_{12}$, $v_{23}$, $v_{34}$, $v^{236}$, $v^{125}$, $v_{347}$, the location coordinate of each traveling wave head monitoring sensor, and the arrival moment of the traveling wave head are substituted into the following equations to solve $v_{236}$, $y_1$, $y_2$, $y_3$, $y_4$, $y_5$, $y_6$, and $y_7$ from the following equations, where $y_1$, $y_2$, $y_3$, $y_4$, $y_5$, $y_6$, and $y_7$ are the seven coordinate values of y.

$$y = \frac{(t_0 - t_{21})v + x_0 - x_{21} + y_{21}}{2} =$$
$$\frac{v_{01}(t_0 - t_1) + v_{12}(t_1 - t_2) + v_{236}(t_2 - t_{21}) + x_0 - x_{21} + y_{21}}{2};$$

$$y =$$
$$\frac{(t_1 - t_{21})v + x_1 - x_{21} + y_{21}}{2} = \frac{v_{12}(t_1 - t_2) + v_{236}(t_2 - t_{21}) + x_1 - x_{21} + y_{21}}{2};$$

$$y = \frac{(t_2 - t_{21})v + x_2 - x_{21} + y_{21}}{2} = \frac{(t_2 - t_{21})v_{236} + x_2 - x_{21} + y_{21}}{2};$$

-continued $$y = \frac{(t_3 - t_{21})v + x_3 - x_{21} + y_{21}}{2} = \frac{(t_3 - t_{21})v_{236} + x_3 - x_{21} + y_{21}}{2};$$

$$y = \frac{(t_4 - t_{21})v + x_4 - x_{21} + y_{21}}{2} = \frac{(t_4 - t_3)v_{34} + (t_3 - t_{21})v_{236} + x_4 - x_{21} + y_{21}}{2};$$

$$y = \frac{(t_{11} - t_{21})v + x_{11} - y_{11} - x_{21} + y_{21}}{2} = $$
$$\frac{(t_{11} - t_2)v_{125} + (t_2 - t_{21})v_{236} + x_{11} - y_{11} - x_{21} + y_{21}}{2};$$

$$y = \frac{(t_{31} - t_{21})v + 2x - x_{31} - y_{31} - x_{21} + y_{21}}{2} = $$
$$\frac{(t_{31} - t_3)v_{347} + (t_3 - t_{21})v_{236} + 2x - x_{31} - y_{31} - x_{21} + y_{21}}{2}.$$

Furthermore, the accurate coordinate value of y of the fault point is calculated by using the resultant seven coordinate values of y, i.e., $y_1$, $y_2$, $y_3$, $y_4$, $y_5$, $y_6$, and $y_7$.

In step 408, a target fault point on the complex power line is determined according to the coordinate of the first fault point and the coordinate of the second fault point.

It should be noted that the final fault point coordinate (x, y, t) is determined by calculating the coordinate location of the fault point on the trunk line, that is, to acquire the coordinate of the first fault point, further determining the branch where the fault occurs, and using the arrival moment of the traveling wave head monitoring sensor of the branch line to verify the fault point location, that is, to determine the coordinate of the second fault point.

Embodiments of the present disclosure provide a method for locating a fault of a complex power line with the following beneficial effects: (1) according to the present application, a multi-branch complex line is transformed into coordinates, a horizontal ordinate of the fault point on the trunk line is calculated, and a vertical ordinate of the fault point is calculated by using the wave head arrival moment and coordinate of the branch line traveling wave head monitoring sensor, to determine the location of the fault point, which addresses the problem that the double ended traveling wave locating often fails in a complex line; (2) the present application provides a reliable, economical and accurate method and system for locating a fault of a multi-branch complex AC and DC power transmission and distribution line, and the organization and solution of the fault-locating equation for the multi-branch complex line are facilitated for computer analysis, which renders a progress in the current traveling wave locating technology; (3) The fault-locating equation for the multi-branch complex line in the present application is simple and reliable, overcoming the defect of the current traveling wave locating method that traveling wave monitoring sensors need to be installed at the head and tail ends of each section of the complex line and the locating process is complex; in the case of missing the arrival moment of any traveling wave monitoring sensor, only one equation is lost, without changing the form of the equations, and the wave speed of each traveling wave of each section of the multi-branch complex line and the location of the fault point can be conveniently derived.

Figure 6:
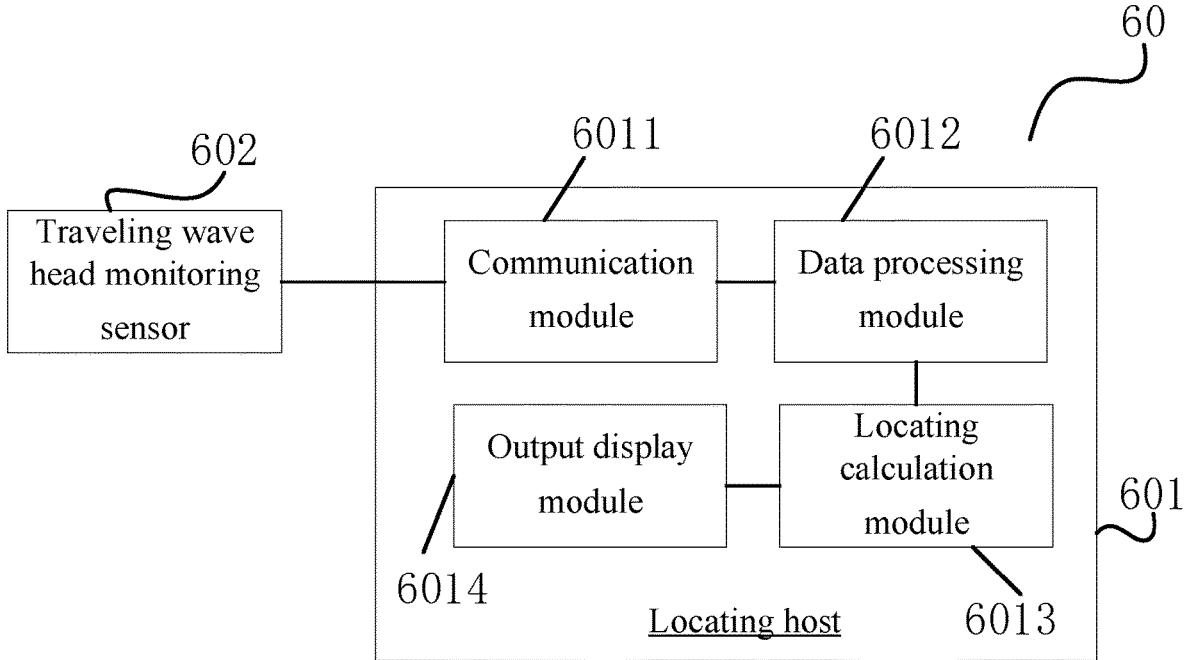
FIG. 6 is a schematic diagram of a system for locating a fault of a complex power line according to an embodiment of the present disclosure.

FIG. 6 is a schematic diagram of a system for locating a fault of a complex power line according to an embodiment of the present disclosure; as shown in FIG. 6, the system 60 for locating a fault of a complex power line includes: a locating host 601, and traveling wave head monitoring sensors 602 arranged on the complex power line.

The locating host 601 includes a communication module 6011, a data processing module 6012, a locating calculation module 6013, and an output display module 6014, and the communication module 6011, the data processing module 6012, the locating calculation module 6013, and the output display module 6014 are electrically connected in sequence.

The traveling wave head monitoring sensor 602 is used for monitoring a traveling wave of a voltage or a traveling wave of a current of the complex power line so as to obtain an arrival moment when a traveling wave head reaches each monitoring point, and the traveling wave head monitoring sensors correspond to the monitoring points on a one-to-one basis; the communication module 6011 is used for communicating with the traveling wave locating sensor, and acquiring the arrival moment of the traveling wave head and a traveling wave waveform; the data processing module 6012 is used for performing data processing on the arrival moment and traveling wave waveform, and outputting the data-processed arrival moment and traveling wave waveform to the locating calculation module; the locating calculation module 6013 is used for obtaining a coordinate of each monitoring point by using the arrival moment corresponding to each of the monitoring points and a line location of the monitoring point, and locating a fault by using coordinates of first monitoring points on the trunk line, a traveling wave propagation speed from one to another of the first monitoring points, and a trunk line fault-locating equation, so as to obtain a coordinate of a first fault point on the trunk line; determining whether a second fault point exists on the branch line by using the coordinate of the first fault point and a coordinate of a branch point corresponding to each branch line on the trunk line; locating a fault, if there is a second fault point on the branch line, by using the coordinate of the first fault point, the coordinates of the first monitoring points on the trunk line, coordinates of second monitoring points on the branch line, the traveling wave propagation speed from one to another of the first monitoring points, a traveling wave propagation speed from one to another of the second monitoring points, and a branch line fault-locating equation, so as to obtain a coordinate of the second fault point of the complex power line; and determining a target fault point on the complex power line according to the coordinate of the first fault point and the coordinate of the second fault point; the output display module 6014 is used for displaying the state of each traveling wave head monitoring sensor on the complex power line, each monitoring point and the coordinate of each monitoring point, the target fault point and a coordinate of the target fault point, and fault distance information.

The present disclosure provides a system for locating a fault of a complex power line. With the system, several traveling wave head monitoring sensors are provided on a complex power line, and the traveling wave head monitoring sensors correspond to monitoring points on a one-to-one basis, so as to obtain several monitoring points on the complex power line; the complex power line is transformed into coordinates in conjunction with an arrival moment and a line location corresponding to the monitoring points, thereby establishing a trunk line fault-locating equation related to the line location, the arrival moment, and a traveling wave propagation speed; a first fault point can thus be derived simply and quickly; on the basis of a coordinate of the first fault point and a coordinate of a branch point corresponding to a branch line on the trunk line, a determination is made as to whether it is located on the branch line, and if it is located on the branch line, a branch line fault-locating equation related to the line location, the arrival moment, and the traveling wave propagation speed is established; a second fault point can thus be derived simply and quickly; finally, a target fault point of the complex power line can be obtained on the basis of the first fault point and the second fault point.

In theory, there is no dead zone in locating the fault, and it is not necessary to determine a fault section first; the equation is simple, and so is the locating principle. This method addresses the deficiency in double-ended traveling wave locating where the fault section needs to be determined first and the location accuracy is affected by a fixed light speed of the traveling wave; a locating path needs not to be planned again, and the wave speed can be calculated in real-time, hence the locating calculation is reliable and accurate.

Figure 7:
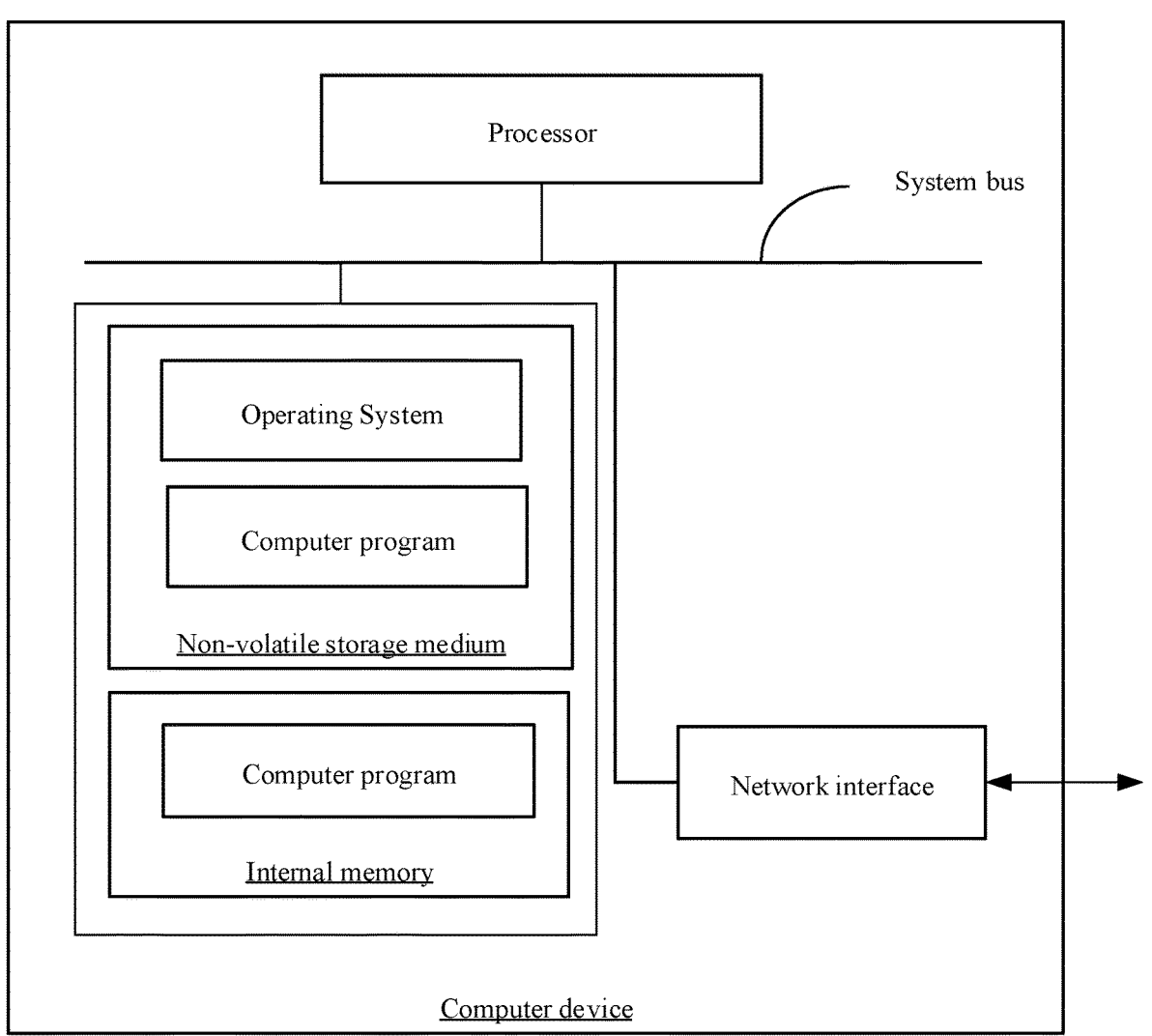
FIG. 7 is a block diagram of a computer device according to an embodiment of the present disclosure.

FIG. 7 illustrates an internal structure of a computer device in an embodiment. The computer device may in particular be a terminal or a server. As shown in FIG. 7, the computer device includes a processor, a memory, and a network interface connected by a system bus. Here, the memory includes a non-volatile storage medium and an internal memory. The non-volatile storage medium of the computer device stores an operating system and may also store a computer program which, when executed by the processor, causes the processor to carry out the method described above. The internal memory may also store a computer program that, when executed by the processor, causes the processor to perform the method described above. It will be appreciated by those skilled in the art that the arrangement shown in FIG. 7 is merely a block diagram of portions of the arrangement relevant to the solution of the present application and does not define the computer device to which the solution of the present application is applied, and that a particular computer device may include more or less components than those shown in the figure, or some components may be combined, or a different arrangement of components is possible.

In an embodiment, a computer device is provided, including a memory and a processor, the memory storing a computer program which, when executed by the processor, causes the processor to perform the steps of the method of FIG. 2 or FIG. 4.

In an embodiment, a computer-readable storage medium is provided, storing a computer program which, when executed by a processor, causes the processor to perform the steps of the method of FIG. 2 or FIG. 4.

It will be appreciated by those of ordinary skill in the art that implementing all or part of the flows of the method of the embodiments described above can be accomplished by a computer program instructing associated hardware; the program can be stored in a non-volatile computer-readable storage medium, and, when executed, can include the flows of the embodiments of the method described above. Here, any references to memory, storage, databases, or other media used in embodiments provided herein may include non-volatile and/or volatile memory. The non-volatile memory may include read-only memory (ROM), programmable ROM (PROM), electrically programmable ROM (EPROM), electrically erasable programmable ROM (EEPROM), or flash memory. Volatile memory can include random access memory (RAM) or external cache memory. By way of illustration and not limitation, RAM is available in many forms such as static RAM (SRAM), dynamic RAM (DRAM), synchronous DRAM (SDRAM), double data rate SDRAM (DDRSDRAM), enhanced SDRAM (ESDRAM), Synchlink DRAM (SLDRAM), Rambus direct RAM (RDRAM), direct memory bus dynamic RAM (DRDRAM), and memory bus dynamic RAM (RDRAM), among others.

All the technical features of the above embodiments can be combined in any form, and for the brevity of the description, not all the possible combinations of all the technical features in the above embodiments are described; however, as long as there is no contradiction in the combinations of these technical features, they should be considered as within the scope of the description.

The embodiments described above represent only a few embodiments of the present application described in detail and should not be construed as limiting the scope of the claims. It should be noted that a person skilled in the art could also make several changes and modifications without departing from the concept of the present application, which shall fall within the scope of the present application. Accordingly, the scope of the present application is defined only by the appended claims.

What is claimed is:

1. A method for locating a fault of a complex power line, comprising:

acquiring arrival moments of traveling wave heads that reach corresponding monitoring points, which are collected by several traveling wave head monitoring sensors on the complex power line, wherein the traveling wave head monitoring sensors are arranged on a trunk line and a branch line of the complex power line, and the traveling wave head monitoring sensors correspond to monitoring points on a one-to-one basis;

acquiring coordinates corresponding to all monitoring points in a target coordinate system corresponding to the complex power line, wherein an origin of coordinates of the target coordinate system is any point on the trunk line, the coordinates comprise a line location corresponding to a monitoring point and an arrival moment corresponding to the monitoring point, and the line location comprises a location on the trunk line and a location on the branch line;

locating a fault by using coordinates of first monitoring points on the trunk line, a traveling wave propagation speed between two of the first monitoring points, and a trunk line fault-locating equation, so as to obtain a coordinate of a first fault point on the trunk line, wherein the traveling wave propagation speed between two of the first monitoring points is different from a speed of light, and the traveling wave propagation speed between two of the first monitoring points is not a fixed value;

determining whether a second fault point exists on the branch line by using the coordinate of the first fault point and a coordinate of a branch point corresponding to each branch line on the trunk line;

locating a fault, if there is a second fault point on the branch line, by using the coordinate of the first fault point, the coordinates of the first monitoring points on the trunk line, coordinates of second monitoring points on the branch line, the traveling wave propagation speed between two of the first monitoring points, a traveling wave propagation speed between two of the second monitoring points, and a branch line fault-locating equation, so as to obtain a coordinate of the second fault point of the complex power line, wherein the traveling wave propagation speed between two of the second monitoring points is different from a speed of light, and the traveling wave propagation speed between two of the second monitoring points is not a fixed value; and determining a target fault point on the complex power line according to the coordinate of the first fault point and the coordinate of the second fault point, wherein locating the fault by using the coordinates of the first monitoring points on the trunk line, the traveling wave propagation speed between two of the first monitoring points, and the trunk line fault-locating equation, so as to obtain the coordinate of the first fault point on the trunk line comprises:

establishing a trunk line fault-locating equation group by using the coordinates of all the first monitoring points, the traveling wave propagation speed between two of the first monitoring points, and the trunk line fault-locating equation;

determining whether the first fault point exists on the trunk line by using the traveling wave propagation speed between two of the first monitoring points in a solution of the trunk line fault-locating equation group; and determining the coordinate of the first fault point according to the traveling wave propagation speed between two of the first monitoring points if the first fault point exists on the trunk line, wherein the trunk line fault-locating equation comprises:

$$\begin{cases} (x-x_0)^2 = (t-t_0)^2 v^2 \\ (x-x_1)^2 = (t-t_1)^2 v^2 \\ (x-x_2)^2 = (t-t_2)^2 v^2 \\ \bullet \\ \bullet \\ (x-x_i)^2 = (t-t_i)^2 v^2 \end{cases} \text{ or } \begin{cases} |x-x_0| + y = |t-t_0|v \\ |x-x_1| + y = |t-t_1|v \\ |x-x_2| + y = |t-t_2|v \\ \bullet \\ \bullet \\ |x-x_i| + y = |t-t_i|v \end{cases},$$

where (x, t) is the coordinate of the first fault point, x is a fault location on the trunk line, t is a fault occurrence moment, $(x_i, t_i)$ is the coordinates of the first monitoring points, $x_i$ is a coordinate location of a first monitoring point i on the trunk line, $t_i$ is the arrival moment of the traveling wave head corresponding to the first monitoring point i, and v is the traveling wave propagation speed between two of the first monitoring points.

2. The method according to claim 1, wherein locating a fault by using the coordinate of the first fault point, the coordinates of the first monitoring points on the trunk line, the coordinates of second monitoring points on the branch line, the traveling wave propagation speed between two of the first monitoring points, the traveling wave propagation speed between two of the second monitoring points, and the branch line fault-locating equation, so as to obtain the coordinate of the second fault point of the complex power line comprises:

establishing a branch line fault-locating equation group by using the coordinate of the first fault point, the coordinates of the first monitoring points on the trunk line, the coordinates of the second monitoring points on the branch line, the traveling wave propagation speed between two of the first monitoring points, the traveling wave propagation speed between two of the second monitoring points, and the branch line fault-locating equation, so as to determine the coordinate of the second fault points.

3. The method according to claim 1, wherein the branch line fault-locating equation comprises:

$$\begin{cases} |x-x_0| + y = |t-t_0|v \\ |x-x_1| + y = |t-t_1|v \\ |x-x_2| + y = |t-t_2|v \\ \bullet \\ \bullet \\ |x-x_i| + y = |t-t_i|v \\ |x-x_{j1}| + |y-y_{j1}| = |t-t_{j1}|v \\ |x-x_{(j-1)1}| + |y-y_{(j-1)1}| = |t-t_{(j-1)1}|v \\ \bullet \\ \bullet \\ |x-x_{11}| + |y-y_{11}| = |t-t_{11}|v \end{cases},$$

where (x, y, t) is the coordinate of the second fault point, x is a fault location on the trunk line, t is a fault occurrence moment, y is a fault location on the branch line $(x_{jn}, y_{jn}, t_{jn})$ is a coordinate of a second monitoring point n on a branch line j, $x_{jn}$ is a coordinate location of the second monitoring point n on the branch line j, $y_{jn}$ is the arrival moment of the second monitoring point n on the branch line j, $t_{jn}$ is a coordinate location of the second monitoring point n on the branch line j, and v is a traveling wave propagation speed between two of the second monitoring points.

4. The method according to claim 3, further comprising:

arranging at least two traveling wave head monitoring sensors on the trunk line if the traveling wave propagation speed is known; and arranging at least three traveling wave head monitoring sensors on the trunk line if the traveling wave propagation speed is unknown.

5. The method according to claim 1, wherein if the arrival moment collected by any of the traveling wave head monitoring sensors is not acquired, the trunk line fault-locating equation comprises:

$$\begin{cases} (x-x_0)^2 = (t-t_0)^2 v^2 \\ (x-x_1)^2 = (t-t_1)^2 v^2 \\ (x-x_2)^2 = (t-t_2)^2 v^2 \\ \bullet \\ \bullet \\ (x-x_{i-1})^2 = (t-t_{i-1})^2 v^2 \end{cases} \text{ or } \begin{cases} |x-x_0| + y = |t-t_0|v \\ |x-x_1| + y = |t-t_1|v \\ |x-x_2| + y = |t-t_2|v \\ \bullet \\ \bullet \\ |x-x_{i-1}| + y = |t-t_{i-1}|v \end{cases},$$

where (x, t) is the coordinate of the first fault point, x is the fault location on the trunk line, t is the fault occurrence moment, $(x_{i-1}, t_{i-1})$ is the coordinates of the first monitoring points, $x_{i-1}$ is a coordinate location of a first monitoring point i−1 on the trunk line, $t_{i-1}$ is the arrival moment of the traveling wave head corresponding to the first monitoring point i−1, and v is the traveling wave propagation speed between two of the first monitoring points.

6. A system for locating a fault of a complex power line, wherein the system serves to perform the method of claim 1, the system comprising a locating host and traveling wave head monitoring sensors arranged on the complex power line, wherein the locating host comprises a communication module, a data processing module, a locating calculation module, and an output display module, wherein the communication module, the data processing module, the locating calculation module, and the output display module are electrically connected in sequence, wherein the traveling wave head monitoring sensors are configured to monitor a traveling wave of a voltage or a traveling wave of a current of the complex power line, so as to obtain arrival moments of traveling wave heads that reach corresponding monitoring points, wherein the traveling wave head monitoring sensors correspond to the monitoring points on a one-to-one basis;

the communication module is configured to communicate with a traveling wave locating sensor, and acquiring an arrival moment of the traveling wave head and a traveling wave waveform;

the data processing module is configured to perform data processing on the arrival moment and the traveling wave waveform, and output a data-processed arrival moment and a data-processed traveling wave waveform to the locating calculation module;

the locating calculation module is configured to:

obtain a coordinate of each of the monitoring points by using an arrival moment corresponding to each of the monitoring points and a line location of each of the monitoring points, and locate a fault by using coordinates of first monitoring points on a trunk line, a traveling wave propagation speed between two of the first monitoring points, and a trunk line fault-locating equation, so as to obtain a coordinate of a first fault point on the trunk line, wherein the traveling wave propagation speed between two of the first monitoring points is different from a speed of light, and the traveling wave propagation speed between two of the first monitoring points is not a fixed value;

determine whether a second fault point exists on a branch line by using the coordinate of the first fault point and a coordinate of a branch point corresponding to each branch line on the trunk line;

locate a fault, if there is a second fault point on the branch line, by using the coordinate of the first fault point, the coordinates of the first monitoring points on the trunk line, coordinates of second monitoring points on the branch line, the traveling wave propagation speed from one to another one of the first monitoring points, a traveling wave propagation speed from one to another one of the second monitoring points, and a branch line fault-locating equation, so as to obtain a coordinate of the second fault point of the complex power line, wherein the traveling wave propagation speed between two of the second monitoring points is different from a speed of light, and the traveling wave propagation speed between two of the second monitoring points is not a fixed value; and determine a target fault point on the complex power line according to the coordinate of the first fault point and the coordinate of the second fault point; and the output display module is configured to display each of the monitoring points and the coordinate of each of the monitoring points on the complex power line, the target fault point and a coordinate of the target fault point, and fault distance information.

7. A non-transitory computer-readable storage medium, storing a computer program, wherein the computer program, when executed by a processor, causes the processor to perform the following steps:

acquiring arrival moments of traveling wave heads that reach corresponding monitoring points, which are collected by several traveling wave head monitoring sensors on the complex power line, wherein the traveling wave head monitoring sensors are arranged on a trunk line and a branch line of the complex power line, and the traveling wave head monitoring sensors correspond to monitoring points on a one-to-one basis;

acquiring coordinates corresponding to all monitoring points in a target coordinate system corresponding to the complex power line, wherein an origin of coordinates of the target coordinate system is any point on the trunk line, the coordinates comprise a line location corresponding to a monitoring point and an arrival moment corresponding to the monitoring point, and the line location comprises a location on the trunk line and a location on the branch line;

locating a fault by using coordinates of first monitoring points on the trunk line, a traveling wave propagation speed between two of the first monitoring points, and a trunk line fault-locating equation, so as to obtain a coordinate of a first fault point on the trunk line, wherein the traveling wave propagation speed between two of the first monitoring points is different from a speed of light, and the traveling wave propagation speed between two of the first monitoring points is not a fixed value;

determining whether a second fault point exists on the branch line by using the coordinate of the first fault point and a coordinate of a branch point corresponding to each branch line on the trunk line;

locating a fault, if there is a second fault point on the branch line, by using the coordinate of the first fault point, the coordinates of the first monitoring points on the trunk line, coordinates of second monitoring points on the branch line, the traveling wave propagation speed between two of the first monitoring points, a traveling wave propagation speed between two of the second monitoring points, and a branch line fault-locating equation, so as to obtain a coordinate of the second fault point of the complex power line, wherein the traveling wave propagation speed between two of the second monitoring points is different from a speed of light, and the traveling wave propagation speed between two of the second monitoring points is not a fixed value; and determining a target fault point on the complex power line according to the coordinate of the first fault point and the coordinate of the second fault point, wherein locating the fault by using the coordinates of first monitoring points on the trunk line, the traveling wave propagation speed between two of the first monitoring points, and the trunk line fault-locating equation, so as to obtain the coordinate of the first fault point on the trunk line comprises:

establishing a trunk line fault-locating equation group by using the coordinates of all the first monitoring points, the traveling wave propagation speed between two of the first monitoring points, and the trunk line fault-locating equation;

determining whether the first fault point exists on the trunk line by using the propagation speed between two of the first monitoring points in a solution of the trunk line fault-locating equation group; and determining the coordinate of the first fault point according to the propagation speed between two of the first monitoring points if the first fault point exists on the trunk line, wherein the trunk line fault-locating equation comprises:

$$\begin{cases}(x-x_0)^2=(t-t_0)^2v^2\\(x-x_1)^2=(t-t_1)^2v^2\\(x-x_2)^2=(t-t_2)^2v^2\\\bullet\\\bullet\\(x-x_i)^2=(t-t_i)^2v^2\end{cases}\text{or}\begin{cases}|x-x|=|t-t_0|v\\|x-x_1|=|t-t_1|v\\|x-x_2|=|t-t_2|v\\\bullet\\\bullet\\|x-x_i|=|t-t_i|v\end{cases},$$

where (x, t) is the coordinate of the first fault point, x is a fault location on the trunk line, t is a fault occurrence moment, $(x_i, t_i)$ is the coordinates of the first monitoring points, $x_i$ is a coordinate location of a first monitoring point i on the trunk line, $t_i$ is the arrival moment of the traveling wave head corresponding to the first monitoring point i, and v is the traveling wave propagation speed between two of the monitoring points.

8. The non-transitory computer-readable storage medium according to claim 7, wherein locating the fault by using the coordinate of the first fault point, the coordinates of the first monitoring points on the trunk line, the coordinates of the second monitoring points on the branch line, the traveling wave propagation speed between two of the first monitoring points, the traveling wave propagation speed between two of the second monitoring points, and the branch line fault-locating equation, so as to obtain the coordinate of the second fault point of the complex power line comprises:

establishing a branch line fault-locating equation group by using the coordinate of the first fault point, the coordinates of the first monitoring points on the trunk line, the coordinates of the second monitoring points on the branch line, the traveling wave propagation speed between two of the first monitoring points, the traveling wave propagation speed between two of the second monitoring points, and the branch line fault-locating equation, so as to determine the coordinate of the second fault point.

9. The non-transitory computer-readable storage medium according to claim 7, wherein the branch line fault-locating equation comprises:

$$\begin{cases}|x-x_0|+y=|t-t_0|v\\|x-x_1|+y=|t-t_1|v\\|x-x_2|+y=|t-t_2|v\\\bullet\\\bullet\\|x-x_i|+y=|t-t_i|v\\|x-x_{j1}|+|y-y_{j1}|=|t-t_{j1}|v\\|x-x_{(j-1)1}|+|y-y_{(j-1)1}|=|t-t_{(j-1)1}|v\\\bullet\\\bullet\\|x-x_{11}|+|y-y_{11}|=|t-t_{11}|v\end{cases},$$

where (x, y, t) is the coordinate of the second fault point, x is a fault location on the trunk line, t is a fault occurrence moment, y is a fault location on the branch line, $(x_{jn}, y_{jn}, t_{jn})$ is a coordinate of a second monitoring point n on a branch line j, $x_{jn}$ is a coordinate location of the second monitoring point n on the branch line j, $y_{jn}$ is a is the arrival moment of the second monitoring point n on the branch line j, $t_{jn}$ is a coordinate location of the second monitoring point n on the branch line j, and v is a traveling wave propagation speed between two of the second monitoring points.

10. The non-transitory computer-readable storage medium according to claim 9, wherein the computer program further causes the processor to perform the following steps:

arranging at least two traveling wave head monitoring sensors on the trunk line if the traveling wave propagation speed is known; and arranging at least three traveling wave head monitoring sensors on the trunk line if the traveling wave propagation speed is unknown.

11. The non-transitory computer-readable storage medium according to claim 7, wherein if the arrival moment collected by any of the traveling wave head monitoring sensors is not acquired, the trunk line fault-locating equation comprises:

$$\begin{cases}(x-x_0)^2=(t-t_0)^2v^2\\(x-x_1)^2=(t-t_1)^2v^2\\(x-x_2)^2=(t-t_2)^2v^2\\\bullet\\\bullet\\(x-x_{i-1})^2=(t-t_{i-1})^2v^2\end{cases}\text{or}\begin{cases}|x-x_0|=|t-t_0|v\\|x-x_1|=|t-t_1|v\\|x-x_2|=|t-t_2|v\\\bullet\\\bullet\\|x-x_{i-1}|=|t-t_{i-1}|v\end{cases},$$

where (x, t) is the coordinate of the first fault point, x is the fault location on the trunk line, t is the fault occurrence moment, $(x_{i-1}, t_{i-1})$ is the coordinates of the first monitoring points, $x_{i-1}$ is a coordinate location of a first monitoring point i−1 on the trunk line, $t_{-1}$ is the arrival moment of the traveling wave head corresponding to the first monitoring point i−1, and v is the traveling wave propagation speed between two of the first monitoring points.

* * * * *